United States Patent [19]
Sato

[11] Patent Number: 6,123,734
[45] Date of Patent: *Sep. 26, 2000

[54] METHOD OF DISPLAYING LOGIC SIMULATION RESULTS AND LOGIC SIMULATION SUPPORT EQUIPMENT

[75] Inventor: Akiko Sato, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/904,863

[22] Filed: Aug. 1, 1997

[30] Foreign Application Priority Data

Mar. 19, 1997 [JP] Japan ................................. 9-066943

[51] Int. Cl.⁷ .................................................. G06F 17/50
[52] U.S. Cl. ........................... 703/15; 345/341; 345/440; 345/507
[58] Field of Search .................... 345/440, 507, 345/341, 342, 973; 703/14, 15

[56] References Cited

U.S. PATENT DOCUMENTS

| | | | |
|---|---|---|---|
| 5,255,365 | 10/1993 | Hungerbuehler | 395/164 |
| 5,359,545 | 10/1994 | Ott et al. | 364/578 |
| 5,371,851 | 12/1994 | Pieper et al. | 395/164 |
| 5,404,435 | 4/1995 | Rosenbaum | 395/147 |
| 5,532,717 | 7/1996 | Jones et al. | 345/202 |
| 5,553,213 | 9/1996 | Sano | 395/140 |
| 5,563,993 | 10/1996 | Sato et al. | 395/140 |
| 5,734,864 | 3/1998 | Satoh | 395/500 |
| 5,758,123 | 5/1998 | Sano et al. | 395/500 |

FOREIGN PATENT DOCUMENTS

| | | |
|---|---|---|
| 6266793 | 9/1994 | Japan . |
| 7-287721 | 10/1995 | Japan . |
| 7334533 | 12/1995 | Japan . |

*Primary Examiner*—Kevin J. Teska
*Assistant Examiner*—Samuel Broda
*Attorney, Agent, or Firm*—Staas & Halsey, LLP

[57] ABSTRACT

A method and equipment provide an extended logic simulation result which can be effectively displayed on one screen. The method of displaying a logic simulation result designates a display point in one cycle which corresponds to a clock signal and which is used in executing a logic simulation. At each cycle corresponding to the clock signal, the signal data at the display point are fetched and displayed continuously on a display unit. Efficiency of work on the display unit is enhanced by analyzing a result of a performed logic simulation during design and examination of logic circuits.

12 Claims, 21 Drawing Sheets

METHOD OF DISPLAYING LOGIC SIMULATION RESULTS AND LOGIC SIMULATION SUPPORT EQUIPMENT

BACKGROUND OF THE INVENTION

1. Field of the Invention

The present invention relates to a method of displaying a result of a logic simulation performed to examine suitability on the design of logic circuits, and a logic simulation support equipment capable of displaying the result of the logic simulation.

2. Description of the Related Art

In recent years, a digital equipment such as a digital computer composed of logic circuits including a printed circuit board and an application specified integrated circuit (ASIC) and the like has increasingly become a large scale and complex system. Generally, the logic simulation is performed in order to examine the suitability of designed logic circuits on the design stage before mass-producing such a digital equipment.

The logic simulation result is displayed on a CRT, etc. While viewing the display, the operator confirms the operation of the logic circuits and finds malfunctions, etc. In such a case, signal waveforms as shown in FIG. 23 and Fig, 24 are displayed as the logic simulation result.

In an example shown in FIG. 23, signal waveforms are displayed as the logic simulation result obtained in a simulation display time interval $\Delta T$ ($=T3-T0$) that was set in advance from a display start time T0. In the conventional display system, output waveforms of specific signals (XAS, XRV) as well as a clock signal (CLK) are displayed on all the points observed in the interval from time T0 to T3.

And, a part of the display shown in FIG. 23 is expanded as shown in FIG. 24 as needed. In an example shown in FIG. 24, the output waveforms are displayed to be expanded in a time interval from time T1 through T2 out of the display shown in FIG. 23. Also in this case, all the points observed in the interval from time T1 to T2 are displayed.

Incidentally, accompanied with large integration of logic circuits in recent years, the analysis of a malfunction requires an enormously long time, when a malfunction is found during the operational confirmation of logic circuits on a design stage. Accordingly, it has been requested to facilitate the operational confirmation of logic circuits and the analysis of malfunctions.

When the operational confirmation of logic circuits and the analysis of malfunctions are performed while referring to a logic simulation result displayed, signal waveforms are expanded or reduced on the display as shown in FIG. 23 and FIG. 24. When finding a malfunction of the logic circuits and analyzing the malfunction, generally the operator refers to the total display of the logic simulation result on the screen. After finding a part having the possibility of a malfunction, the operator refers to a detailed signal value of the part and judges whether or not a malfunction occurs in the part, and in addition, analyzes the malfunction if a malfunction occurs.

Thus, when finding a malfunction of logic circuits from a logic simulation result and analyzing the malfunction, the operator repeats expanding and reducing the display of signal waveforms on one window so as to grasp both the total picture and the detailed parts of the logic simulation result. Expanding and reducing the display on one window in this manner, the operator will break thinking each time when a window display is switched, which lowers efficiency of the work to analyze.

Accordingly, in the technique disclosed in the Japanese Patent Application Laid Open (KOKAI) No. Hei 7 (1995)-287721, a plurality of pairs of display start time and display time interval are set in advance, and signal data corresponding to the display start time and display time interval are each displayed in a plurality of display regions on the display (CRT display unit). According to this technique, the operator can refer to a reduced picture to display the total logic simulation result and a detailed (expanded) picture in a certain time interval on one screen at the same time. Therefore, the operator does not need to break thinking and can easily continue the work to analyze.

However, in the technique disclosed in the foregoing patent application, a time setting file in which the display start time and display time interval for designating a display time are preset has to be made, and the operator cannot optionally designate and change a display start time and display time interval while referring to a logic simulation result.

Further, in the same patent application, as shown in FIG. 23 and FIG. 24, output waveforms as a logic simulation result are displayed on all the points observed through a display time interval from a display start time; and therefore, especially when an extended logic simulation result is displayed, the total picture cannot effectively be displayed on one screen. Consequent y, the operator cannot easily grasp the total logic simulation result, which invites inefficiency of the work to analyze.

SUMMARY OF THE INVENTION

The present invention has been made in view of the foregoing problems, and an object of the present invention is to provide a method of displaying a logic simulation result and a logic simulation support equipment, whereby even an extended logic simulation result can effectively be displayed on one screen so as to efficiently analyze the logic simulation result.

In order to accomplish the foregoing object, a method of displaying a logic simulation result relating to the invention is a method in which waveforms of signal data being a logic simulation result of logic circuits are displayed on a display unit, and is characterized in that a display point in one cycle corresponding to a clock signal used in executing a logic simulation is designated, and at each cycle corresponding to the clock signal, the signal data at the display point are fetched to continuously display on the display unit.

Further, a logic simulation support equipment relating to the invention is characterized by comprising a display unit for displaying waveforms of signal data being a logic simulation result, a signal data storage unit for storing the signal data, a designating unit for designating a display point in one cycle corresponding to a clock signal used in executing a logic simulation, and a display control unit that fetches the signal data at the display point designated by the designating unit at each cycle corresponding to the clock signal from the signal data storage unit and controls the display state of the display unit so as to continuously display on the display unit.

Thus, according to the method of displaying a logic simulation result and the logic simulation support equipment of the invention, signal data at a designated display point are continuously displayed at each cycle corresponding to a clock signal on the display unit. Therefore, even an extended logic simulation result can effectively be displayed on one screen, and in the cycle corresponding to the clock signal, only a signal data at a point that a logic circuit designer desires to refer to can be displayed; thus the work to analyze the logic simulation result can be performed extremely efficiently.

DESCRIPTION OF THE PREFERRED EMBODIMENT

[A] Description on the Aspect of the Invention

Figure 1:
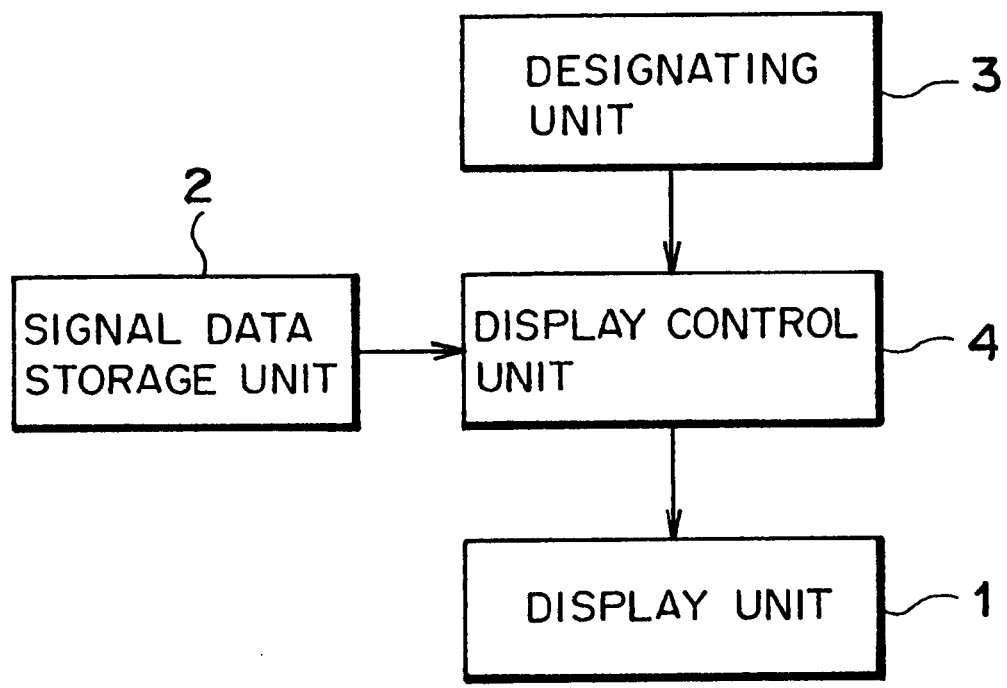
FIG. 1 is a block diagram showing the aspect of the present invention.

FIG. 1 is a block diagram showing the aspect of the invention, as shown in FIG. 1, the logic simulation support equipment according to the invention is composed of a display unit 1, signal data storage unit 2, designating unit 3, and display control unit 4.

The display unit 1 is to display waveforms of signal data being a logic simulation result, the signal data storage unit 2 is to store the signal data, and the designating unit 3 is to designate a display point in one cycle corresponding to a clock signal used in executing a logic simulation.

And, the display control unit 4 is to fetch from the signal data storage unit 2 the signal data at the display point designated by the designating unit 3 at each cycle corresponding to the clock signal, and controls the display state of the display unit 1 so as to display on the display unit 1.

Here, the signal data storage unit 2 may store, at each time that the signal data changes a value thereof, a name of a signal terminal that changes the value at that time and a value after the value having been changed to make a pair as the signal data.

Further, the display control unit 4 may control the display state of the display unit 1 so that the display unit 1 can simultaneously display in a plurality of windows the signal data relating to a signal terminal designated in advance and a name of the signal terminal in a stream format in accordance with a stream of a logic simulation time.

Further, the display control unit 4 may control the display state of the display unit 1 so that the display unit 1 can simultaneously display a subwindow for minutely displaying the signal data at the logic simulation time in a range rectangularly designated on the window and the foregoing window.

Further, when displaying the subwindow, the display control unit 4 may select an appropriate number of display points in one cycle corresponding to the clock signal, fetch from the signal data storage unit 2 the signal data at the appropriate number of the display points at each cycle corresponding to the clock signal, and control the display state of the display unit 1 so that the display unit 1 can continuously display the signal data in the subwindow.

Further, when displaying the subwindow, the logic simulation support equipment may comprise a setting unit for setting an appropriate number of display points in one cycle corresponding to the clock signal, and the display control unit 4 may fetch from the signal data storage unit 2 the signal data at the appropriate number of the display points set by the setting unit at each cycle corresponding to the clock signal and control the display state of the display unit 1 so that the display unit 1 can continuously display the signal data in the subwindow.

On the other hand, when one point in a signal value display region or a time display region is designated in the window, the display control unit 4 may control the display state of the display unit 1 so that the display unit 1 can display a marker indicating a time corresponding to the point in the window.

In the same manner, when one point in a signal value display region or a time display region is designated in the subwindow, the display control unit 4 may control the display state of the display unit 1 so that the display unit 1 can display a marker indicating a time corresponding to the point in the subwindow.

Further, the logic simulation support equipment may comprise a comment applying unit for applying a comment to the marker displayed in the window, and a comment storage unit for storing a comment applied by the comment applying unit.

Further, when receiving a retrieval instruction on the comment, the logic simulation support equipment may comprise a retrieval unit for executing a retrieval in the comment storage unit serving the comment as a key, and when the comment given the retrieval instruction thereto is retrieved by the retrieval unit, the display control unit 4 may control the display state of the display unit 1 so that the display unit 1 can scroll in the window and display a part including the marker having the comment applied in the window.

Still, the logic simulation support equipment may comprise a signal terminal name editing unit for editing signal terminal names of the signal data to be displayed in the window and making a file in which the signal terminal names are enumerated, and the display control unit 4 may control the state of the display unit 1 so that the display unit 1 can display the signal terminal names enumerated in the file and the signal data of signal terminals corresponding to the signal terminal names.

According to the foregoing construction of the logic simulation support equipment relating to the invention, since signal data at a display point designated by the designating unit 3 are continuously displayed on the display unit 1 at each cycle corresponding to a clock signal, even an extended logic simulation result can be displayed effectively on one screen, and in addition, only a signal data at a point that an operator desires to refer to can be displayed in the cycle corresponding to the clock signal.

Here, it is not necessary to store the signal data through the whole time. Since the signal data storage unit 2 stores only the signal data at each time when a value change occurs, the signal data storage unit 2 can store the signal data efficiently even if the signal data amount to a vast quantity for a long period.

And, since the signal data relating to a signal terminal designated in advance with a name of the signal terminal are simultaneously displayed in a plurality of windows in a stream format in accordance with a stream of a logic simulation time, an operator can easily grasp the perspective even if the logic simulation result is an extended one by referring to a plurality of the windows.

Further, since the signal data at the logic simulation time rectangularly designated on the window are displayed simultaneously by a subwindow, an operator can simultaneously refer to the window that displays the overall logic simulation result and the subwindow that displays details in an optional time interval so that the operator can perform the analysis work without breaking thinking.

Further, when displaying the subwindow, since an appropriate number of display points in one cycle corresponding to the clock signal are selected and the signal data at the appropriate number of the display points are continuously displayed in the subwindow, a range rectangularly designated on the window can be expanded automatically into an appropriate size c(n the screen, without the whole points expanded.

Further, when displaying the subwindow, since an appropriate number of display points in one cycle corresponding to the clock signal are set by a setting unit and the signal data at the appropriate number of the display points set are continuously displayed in the subwindow, a range rectangularly designated on the window is automatically expanded to be displayed, without the whole points expanded, only on a point that an operator desires to refer to.

On the other hand, when one point of the signal value display region or a time display region is designated in the window or the subwindow, since a marker indicating a time corresponding to the point is displayed, an operator can easily grasp the state of signals owing to the marker even if signal data relating to multiple signal terminals are simultaneously displayed in the window or the subwindow.

And, since an operator can apply a comment to the marker displayed in the window through a comment applying unit, whereby a comment storage unit can store the comment, the operator can easily leave a comment to the marker position during the work to analyze the logic simulation result with easiness to take a note on a memo pad.

Further, when the retrieval unit retrieves a comment applied to a marker and found the comment, since a part including the marker having the comment applied is automatically scrolled in the window, it become possible that an operator easily retrieves and confirms the part having the comment left.

Still, an operator makes a file including signal terminal names of the signal data to be displayed in the window by means of the signal terminal name editing unit, and thereby edits a display region of the signal terminal names in the window and the result from the edition is reflected on the display region of the signal data; and therefore, only the signal data of the signal terminals that the operator desires to refer to can be displayed in a desired order.

Thus, according to the logic simulation support equipment of the invention, the following effects and advantages can be achieved.

(1) since signal data at a display point designated are continuously displayed at each cycle corresponding to a clock signal on the display unit 1, even an extended logic simulation result can be displayed effectively on one screen, and in addition, only signal data at a point that a logic circuit designer desires to refer to can be displayed in the cycle corresponding to the clock signal, so that the work to analyze a logic simulation result can be performed very efficiently.

(2) Since only the signal data at each time when a value change occurs are stored, the signal data can efficiently be stored even if the quantity of signal data becomes enormous over a long period of time, which contributes to reducing the memory capacity and cost (3) Since the signal data are displayed simultaneously in a plurality of windows in a stream format in accordance with a stream of a logic simulation time, a logic circuit designer can easily grasp the perspective even if a logic simulation result is an extended one by referring to a plurality of the windows, thus contributing to increasing efficiency of the work to analyze a logic simulation result.

(4) Since the signal data in an optional time interval rectangularly designated on the window can simultaneously be displayed by a subwindow, while referring to the perspective of the logic simulation result and the picture (expanded picture) that minutely displays the signal data in an optional time interval at the same time, a logic circuit designer can perform the analysis easily without breaking thinking, thus significantly contributing to increasing efficiency of the work to analyze the logic simulation result.

(5) When displaying the subwindow, since a range rectangularly designated on the window can be expanded automatically into an appropriate size on the screen without the whole points expanded, a part that a logic circuit designer desires to refer to in detail can be displayed to be expanded effectively in the subwindow.

(6) When displaying the subwindow, since an optional time interval rectangularly designated on the window can automatically be expanded and displayed only on a point that a logic circuit designer desires to refer to without the whole points expanded, only the signal data of the point that the logic circuit designer desires to minutely refer to can be fetched and displayed to be effectively expanded in the subwindow.

(7) Since a marker indicating a time corresponding to a designated point can be displayed, even if signal data relating to multiple signal terminals are simultaneously displayed in the window or the subwindow, a logic circuit designer can easily grasp the state of signals at the time by means of tin marker, which contributes to further increasing efficiency of the work to analyze the logic simulation result.

(8) Since a comment can be applied to the marker displayed in the window, a comment to the marker position can easily be left during the work to analyze the logic simulation result with easiness to take a note on a memo pad; and an operator can perform the work to analyze the logic simulation result efficiently while referring to the comment.

(9) since a comment applied to a marker is retrieved and a part including the marker having the comment applied can automatically be scrolled and displayed in the window, a logic circuit designer can easily retrieve and confirm the part having the comment left, which contributes to further increasing efficiency of the work to analyze the logic simulation result.

(10) Since a display region of the signal terminal names in the window is edited and the result from the edition is reflected on the display region of the signal data, only the signal data of the signal terminals that the operator desires to refer to can be displayed in a desired order, which greatly contributes to increasing efficiency of the work to analyze the logic simulation result.

[B] Description of One Embodiment of the Invention

The embodiment of the invention will hereafter be described with reference to the accompanying drawings.

Figure 2:
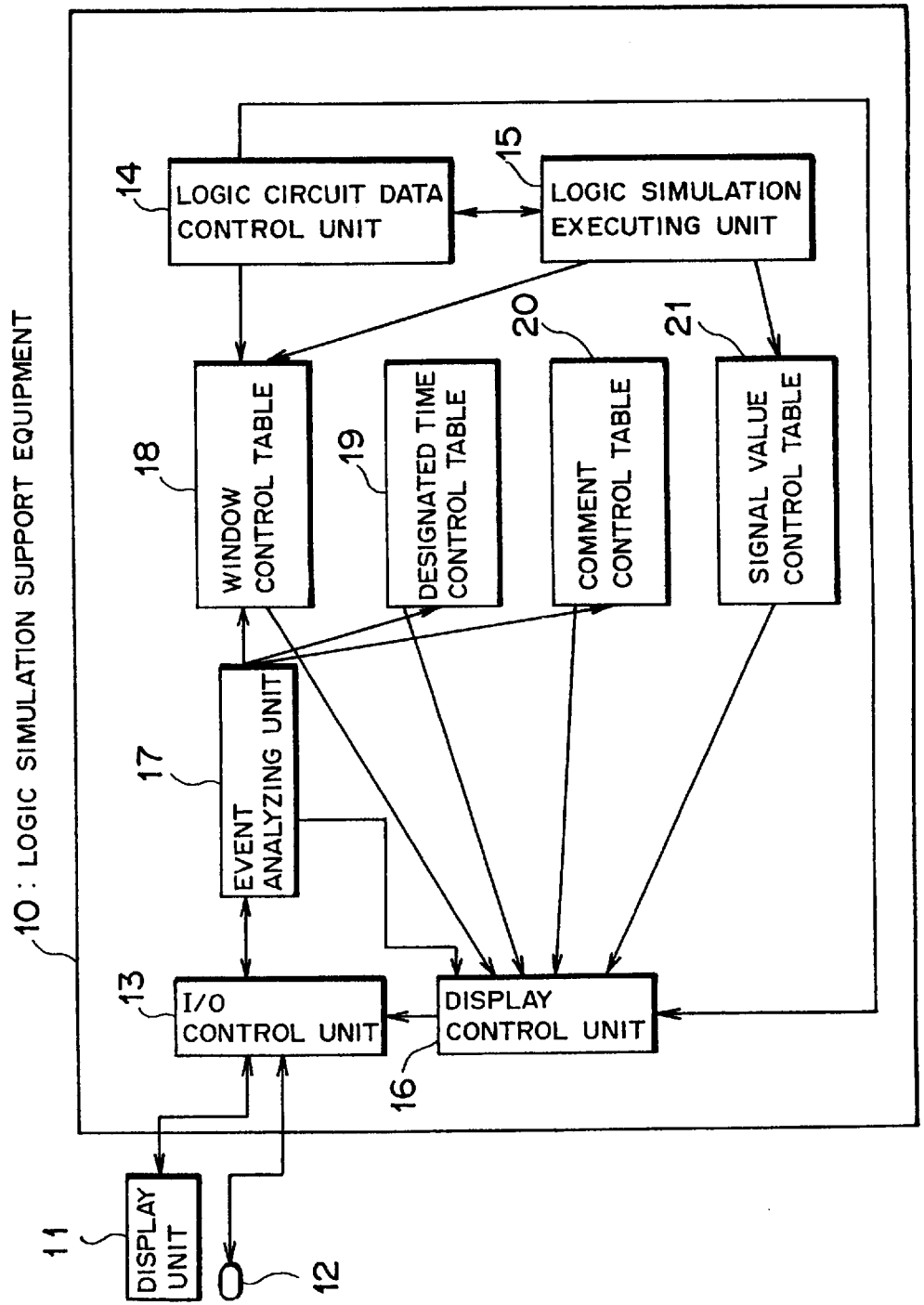
FIG. 2 is a block diagram showing a construction of a logic simulation support equipment as one embodiment of the invention.

FIG. 2 is a block diagram showing a construction of a logic simulation support equipment as one embodiment of the invention, as shown in FIG. 2, and a logic simulation support equipment 10 of this embodiment is composed of a general personal computer having a display unit 11 and an input device 12, and the like. The logic simulation support equipment 10 is designed to execute a logic simulation, while interacting with a user or an operator (logic circuit designer) through displays on the display unit 11, and to display the result of the logic simulation on the display unit 11.

Here, the display unit 11 is to display waveforms of signal data being a logic simulation result of logic circuits as described above. The input device 12 is, for example, a key board and a mouse, which is operated by a user or an operator, and is to load various instructions relating to displays of a logic simulation and logic simulation result into the logic simulation support equipment 10.

And as shown in FIG. 2, the logic simulation support equipment 10 has functions as an input output control unit 13, logic circuit data control unit 14, logic simulation executing unit 15, display control unit 16, event analyzing unit 17, window control table 18, designated time control table 19, comment control table 20, and signal value control table 21. These functions will now be described.

The input output control unit 13 is to interface with the display unit 11 and the input device 12.

The logic circuit data control unit 14 is to control data of logic circuits being an object for a logic simulation. Since, practically, the logic circuit data are described by means of signal terminal numbers, the logic circuit data control unit 14 is to control a correspondence between the signal terminal number and a signal terminal name defined by a user.

The logic simulation executing unit 15 is to execute a logic simulation of logic circuits controlled by the logic circuit data control unit 14 and to register the data of the logic simulation result in the signal value control table 21.

The display control unit 16 is to control to display data of a logic simulation result on the display unit 11 in accordance with an event analysis result by the event analyzing unit 17, using date controlled by each of the window control table 18, signal value control table 21, and designated time control table 19. The display control unit 16 has the following control functions (1) to (8).

(1) To control a display state of the display unit 11 such that the display control unit 16 fetches a signal data (signal value) at a display point (described later in FIG. 6) set on the window control table 18 at each cycle corresponding to a clock signal from the signal value control table 21 and displays the signal data continuously on the display unit 11; and further in this case, to control the display state of the display unit 11 such that the display unit 11 displays a signal value on a signal terminal (being set on the window control table 18) designated in advance with a name of the signal terminal simultaneously in one or more stream windows 30 (refer to FIGS. 7, 9, 10) in a stream format in accordance with a stream of a logic simulation time.

(2) To control the display state of the display unit 11 such that the display unit 11 displays a substream window 31 (refer to FIG. 8, FIG. 11) that minutely displays a signal value at a logic simulation time of a range (refer to symbol 30 in FIG. 7 or FIG. 10) rectangularly designated on the stream window 30 simultaneously with the stream window 30.

(3) To control the display state of the display unit 11 when displaying the substream window 31, when the "auto" mode (described later in FIG. 10) is selected, such that the display control unit 16 automatically selects an appropriate number of display points in one cycle corresponding to a clock signal, fetches signal value at the appropriate number of display points at each cycle corresponding to the clock signal from the signal value control table 21, and the display unit 11 displays the signal value continuously in the substream window 31.

(4) To control the display state of the display unit 11 when displaying the substream window 31, when the "designate" mode (described later in FIG. 10) is selected, such that the display control unit 16 fetches signal value at the appropriate number of display points at each cycle corresponding to the clock signal from the signal value control table 21 and the display unit 11 displays the signal value continuously in the substream window 31.

(5) To control the display state of the display unit 11 when one point in the signal value display region or time display region is designated in the stream window 30 such that the display unit 11 displays a time indicating marker 30*i* (refer to FIG. 10) to indicate a time corresponding to the point in the stream window 30.

(6) To control the display state of the display unit 11 when one point in the signal value display region or time display region is designated in the substream window 31 such that the display unit 11 displays a time indicating marker 31*d* (refer to FIG. 11) to indicate a time corresponding to the point in the substream window 31.

(7) To control the display state of the display unit 11 when a desired comment is retrieved by a retrieval function (described later) such that the display unit 11 scrolls in the stream window 30 and displays a part including the time indicating marker 30i having the comment applied in the stream window 30.

(8) To control the display state of the display unit 11 such that the display unit 11 displays signal terminal names enumerated in a file made by a signal terminal name editing function described later and the signal value of signal terminals corresponding to the signal terminal names in the stream window 30.

The event analyzing unit 17 is to identify an instruction information (display point, rectangle designation, designation time, comment, etc.) transmitted from the input device 12 by means of interaction with a user or an operator and to make the window control table 18, comment control table 20, designated time control table 19. Especially, the event analyzing unit 17 performs the following functions (1) to (5) as the characteristic functions of the invention.

(1) Function as a designating unit for designating a display point in one cycle corresponding to a clock signal when displaying the stream window 30. When the instruction information is a display point received from the input device 12, the event analyzing unit 17 sets the designated display point to a display point region (refer to item "2" in FIG. 3) in a display control data of the stream window 30 controlled by the window control table 18.

(2) Function as a setting unit for setting an appropriate number of points in one cycle corresponding to a clock signal when displaying the substream window 31. As described later in FIG. 10, when displaying the substream window 31, in case the "designate" mode is selected, the event analyzing unit 17 sets the appropriate number ot display points set in a display point setting region 20h (refer to FIG. 10) by operating the input device 12 to a display point region (refer to ② in FIG. 3) in a display control data of the substream window 31 controlled by the window control table 18.

(3) Function as a comment applying unit for applying a comment to the time indicating marker 30i displayed in the stream window 30. As described later in FIG. 10 and FIG. 12, the event analyzing unit 17 stores into the comment control table 20 a comment input and set on a comment input/retrieval screen 32 displayed by the input device 12 clicking a "comment" display region 30k.

(4) Function as a comment retrieval unit, when receiving a retrieval instruction on a comment, that retrieves the comment from the comment control table 20 using the comment as a key. As described later in FIG. 10 and FIG. 12, the event analyzing unit 17 retrieves from the comment control table 20 a comment given the retrieval instruction on the comment input/retrieval screen 32 displayed by the input device 12 clicking the "comment" display region 30k.

(5) Function as a signal terminal name editing unit (editor as a editing tool) for editing signal terminal names of signal value displayed in the stream window 30 and making a file in which the signal terminal names are enumerated. As described later in FIG. 10 and FIG. 13, the event analyzing unit 17 sots signal terminal names edited a signal terminal name editing screen 33 displayed by the input device 12 clicking an "edit" display region 30m to a signal terminal name region (refer to ⑥ in FIG. 3) in the display control data of the stream window 30 controlled by the window control table 18. In this case, the event analyzing unit 17 also sets the number of signal terminals to be displayed to a display signal terminal number region in the display control data.

Figure 3:
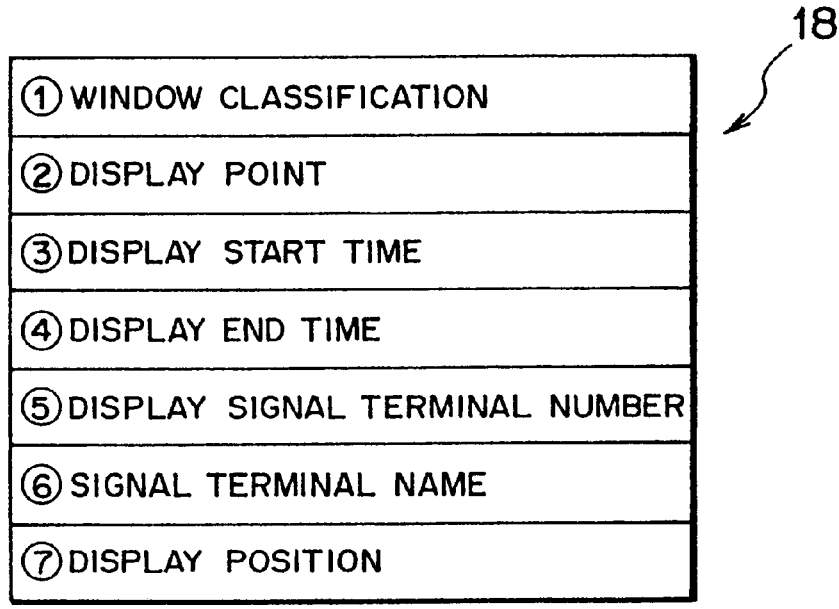
FIG. 3 is a chart for explaining data controlled by a window control table of the embodiment.
Figure 4:
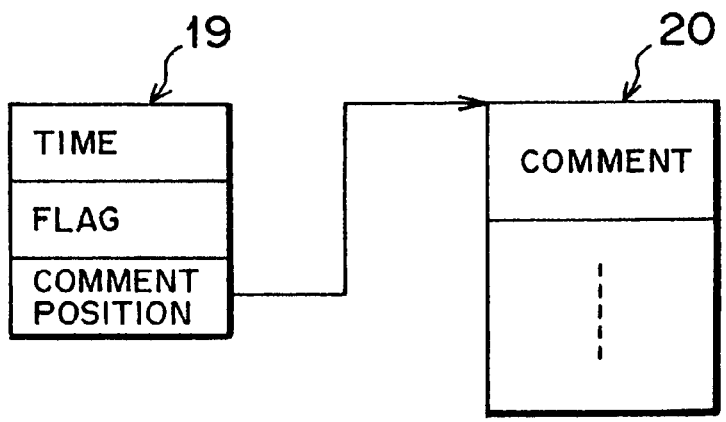
FIG. 4 is a chart for explaining data controlled by a designated time control table and a comment control table (comment storage unit)
Figure 5:
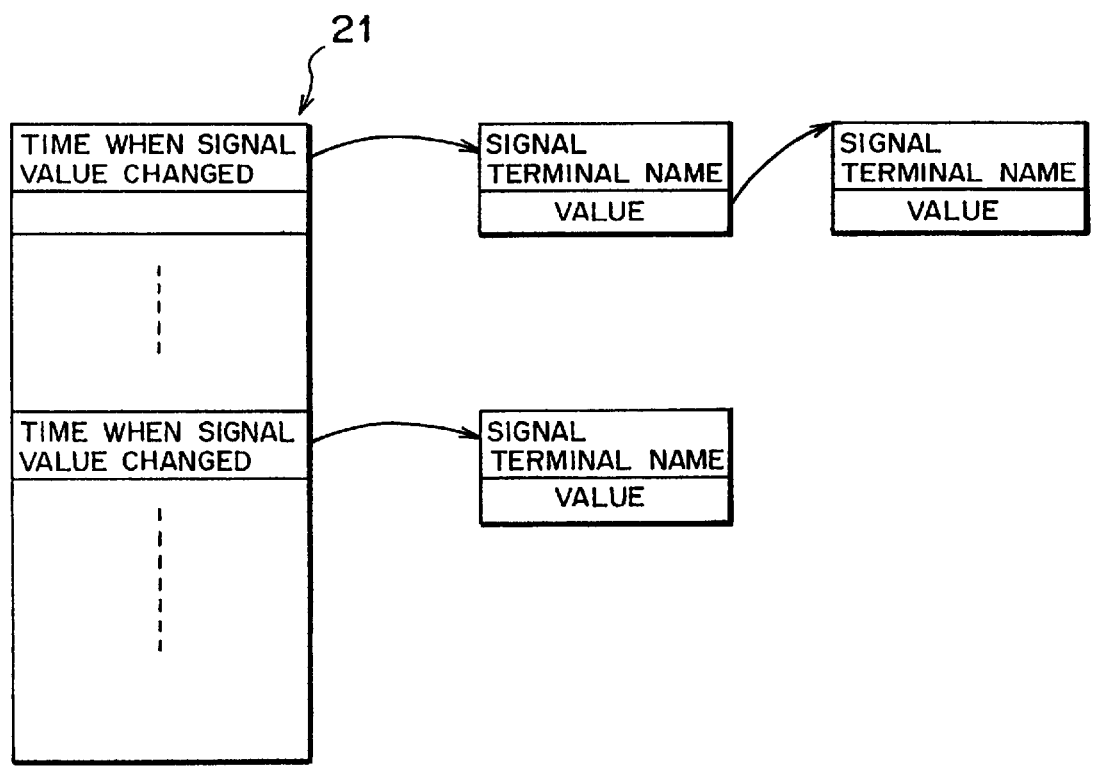
FIG. 5 is a chart for explaining data controlled by a signal value control table (signal data memory) of the embodiment.

Next, the control tables 18 through 21 used in displaying data of a logic simulation result relating to the embodiment will be described in detail with reference to FIG. 3 through FIG. 5. FIG. 3 is a chart for explaining data controlled by the window control table 18, FIG. 4 is a chart for explaining data controlled by the designated time control table 19 and the comment control table 20, and FIG. 5 is a chart for explaining data controlled by the signal value control table 21.

The window control table 18 is to control a display control data for controlling a display state of one or more stream windows 30 or substream windows 31 to be displayed on the display unit 11, for each window, and controls an attribute data given to each of the windows 30, 31 as a display control data.

In the window control table 18, as concretely shown in FIG. 3, are controlled ① window classification, ② display point, ③ display start time, ④ display end time, ⑤ display signal terminal number, ⑥ signal terminal name, and ⑦ display position.

① window classification is to indicate whether a window set through the event analyzing unit 17 from the input device 12 is the stream window or the substream window.

② display point is to indicate, as described later in FIG. 6, a position on which a signal value in one cycle corresponding to a clock signal is displayed.

③ display start time and ④ display end time correspond to a simulation start time and a simulation end time, which are to indicate a time interval of a logic simulation result that is to be practically displayed on the display unit 11. A display region in the right and left direction of each window is determined in accordance with the time interval.

⑤ display signal terminal number is to indicate the number of kinds of signal data (signal values) to be displayed in the window, and this number determines a display area of the window in the vertical direction.

⑥ signal terminal name is to indicate the kind of signal data (signal value) to be displayed in the window.

⑦ display position is to indicate a display position of the window in the screen of the display unit 11.

The designated time control table 19 is to control a designation time designated by a user or an operator on the basis of an analysis given by the event analyzing unit 17 through an interaction with a user or an operator. Namely, when the user or operator operates the input device 12 and designates one point in the signal value display region or the time display region in the stream window 30 or the substream window 31, the designated time control table 19 controls a time corresponding to the point.

In the designated time control table 19, as shown in FIG. 4, are controlled a designated time, a flag indicating whether or not a comment to the designated time (time indicating marker 30i) is defined, and a comment storage position (pointer; address in the comment control table 20) when the comment is defined.

The comment control table (comment storage unit) 20 is to control a comment given by a user or an operator on the basis of an analysis by the event analyzing unit 17 through an interaction with the user or operator. Namely, as shown in FIG. 4, the comment control table 20 controls a comment defined at the designated time, in accordance with a pointing by the designated time control table 19.

And, the signal value control table (signal data storage unit) 21 is to control a time series data of each signal value at each of signal terminals constituting a logic simulation result. In this embodiment, as shown in FIG. 5, at each time when the signal value changes (time accompanied by a change), the signal value control table 21 stores a name of a signal terminal of which value changed at the time and a value after the value having been changed to make a pair.

As described above, the window control table 18 controls display modes (display control data) of one or a plurality of the windows 30, 31 to be displayed on the display unit 11; however, the display in each of the set windows 30, 31 is made by referring to the designated time control table 19 and signal value control table 21.

When a retrieval of a comment defined by a user or an operator is instructed, the retrieval is done in the comment control table 20; and when a corresponding comment is found, the time is set on the window control table 18 and is informed to the display control unit 16 to execute an automatic scroll. The display unit 11 displays a part including the time indicating marker 30*i* having the comment applied in the stream window 30.

When the editing function of signal terminal names is designated by a user or an operator, a signal terminal name on the screen is obtained by referring to the window control table 18, the name is stored in a text file, a result that the file is edited by the editing tool (editor) is read, the signal terminal name is registered by the window control table 18, and the name is informed to the display control unit 16; and thereby, the display state of the signal terminal is edited.

Next, a display processing example of data on the logic simulation result by a system relating to this embodiment will be described with reference to FIG. 6 through FIG. 13.

First, a method of designating a display point in one cycle in this embodiment will be described concretely with reference to FIG. 6.

Figure 6:
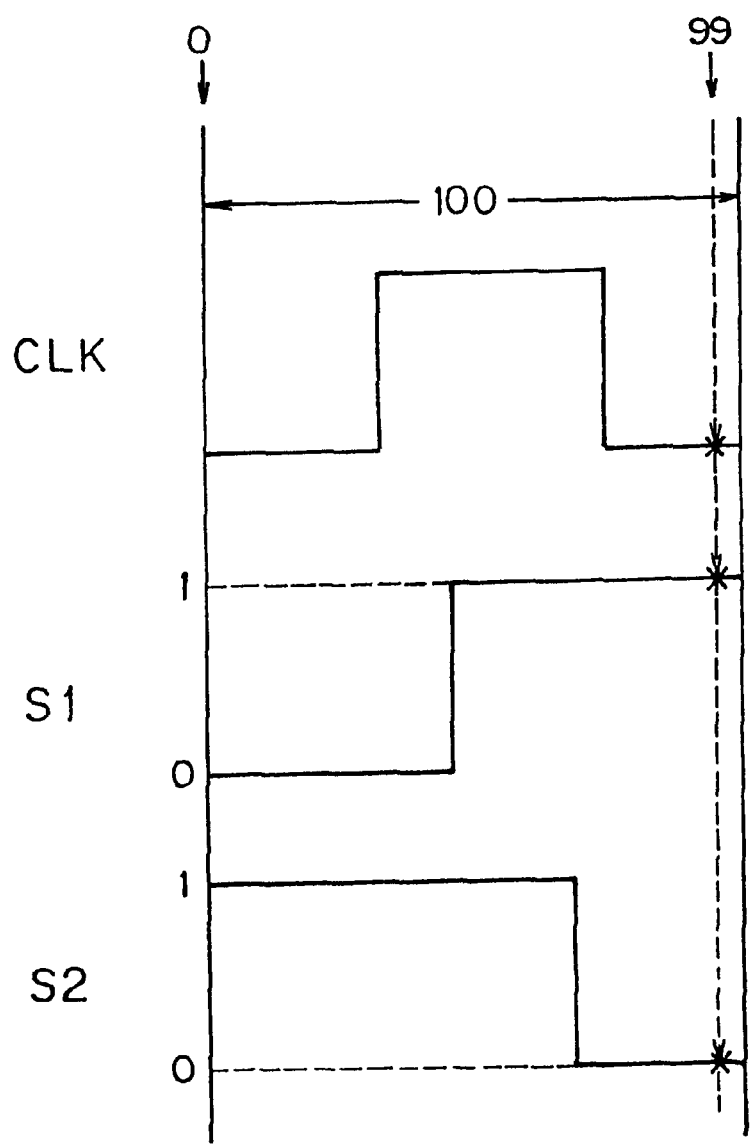
FIG. 6 is a chart for explaining a method of designating a display point concretely in one cycle in the embodiment.

As shown in FIG. 6, when, for example, 100 times are assumed as one cycle (one period for a clock signal CLK in executing a logic simulation), all the signal values in the 100 times are not displayed as to the one cycle in this embodiment. At least one point in the one cycle is designated as a display point, only a signal value in the display point in each cycle is fetched at each cycle, and signal value are continuously displayed in the window 30 or 31 on the display unit 11.

Since the signal values at signal terminals become stabilized after a certain time passes from the moment that the clock signal is given, for example, the 99th point of 100 points of 0 to 100 in one cycle is designated. In this case, in the cycle shown in FIG. 6, 1 is given as the signal value at a signal terminal S1, 0 is given as the signal value at a signal terminal S2, and the signal values are each displayed as the representative values at the signal terminals S1, S2. Thus, as shown in FIG. 7, as the signal values at the signal terminals (CLK, Sin, Sout) designated in advance, the signal values at the 99th points (99, 199, 299, . . . ) in each cycle are continuously displayed in the stream window 30.

Figure 7:
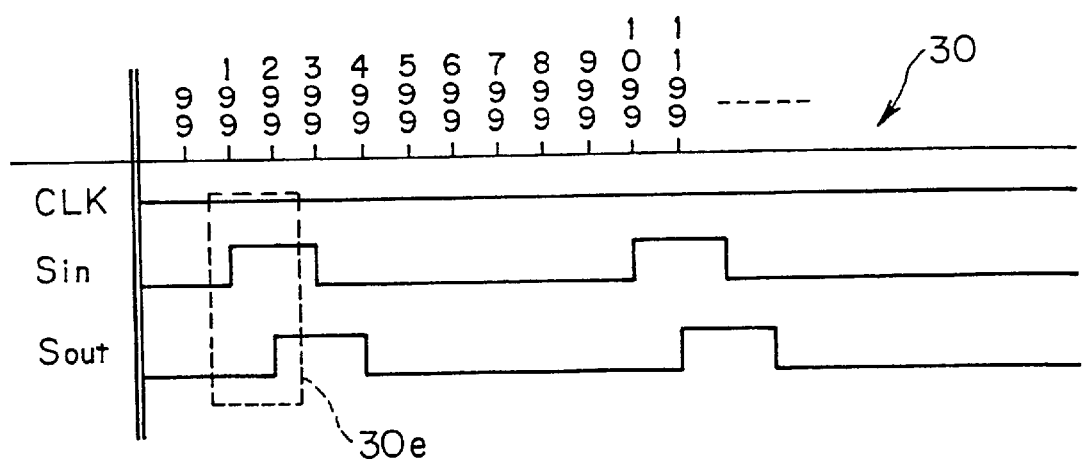
FIG. 7 is a chart showing a basic display example of signal data in the embodiment.
Figure 8:
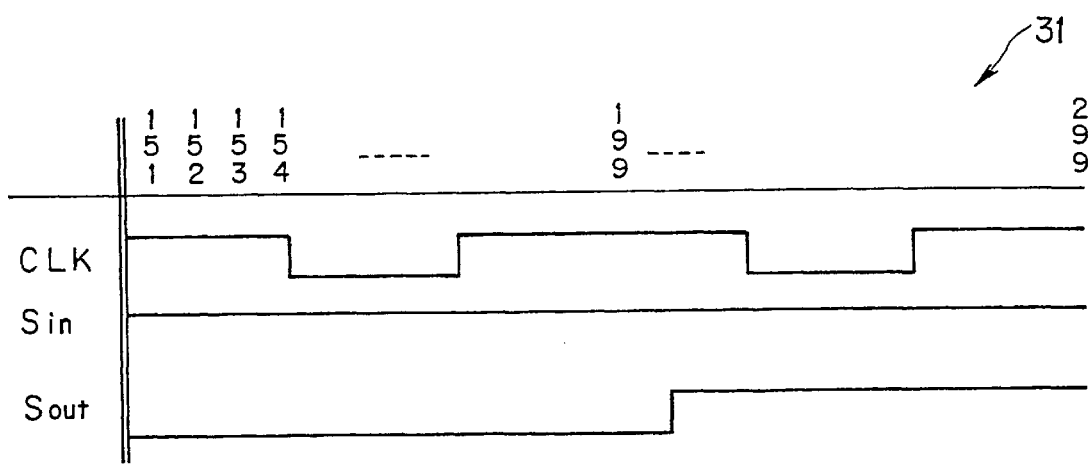
FIG. 8 is a chart showing a basic expanded display example of signal data in the embodiment.

And, in this embodiment, when a rectangular designation display 30*e* is done in the stream window 30 shown in FIG. 7, the signal values in the rectangular -resignation display 30*e* are expanded and displayed as the substream window 31 shown in FIG. 8 simultaneously with the stream window 30.

When the substream window 31 is displayed in this manner, an appropriate number of the display points in one cycle in the substream window 31 may be set automatically, or may be designated by a user or an operator as described later.

Further, as the display point in the stream window 30 or the substream window 31, a plurality of points in one cycle, for example, four points from 25th, 50th, 75th, and 99th are designated, and the signal values at the plural display points in each cycle can continuously be displayed each in the stream window 30 and the substream window 31.

However, in an expanded display example shown in FIG. 8, all the 100 points in one cycle are displayed as the display points; and therefore, the signal values at all the points in each cycle are continuously displayed in the substream window 31.

Figure 9:
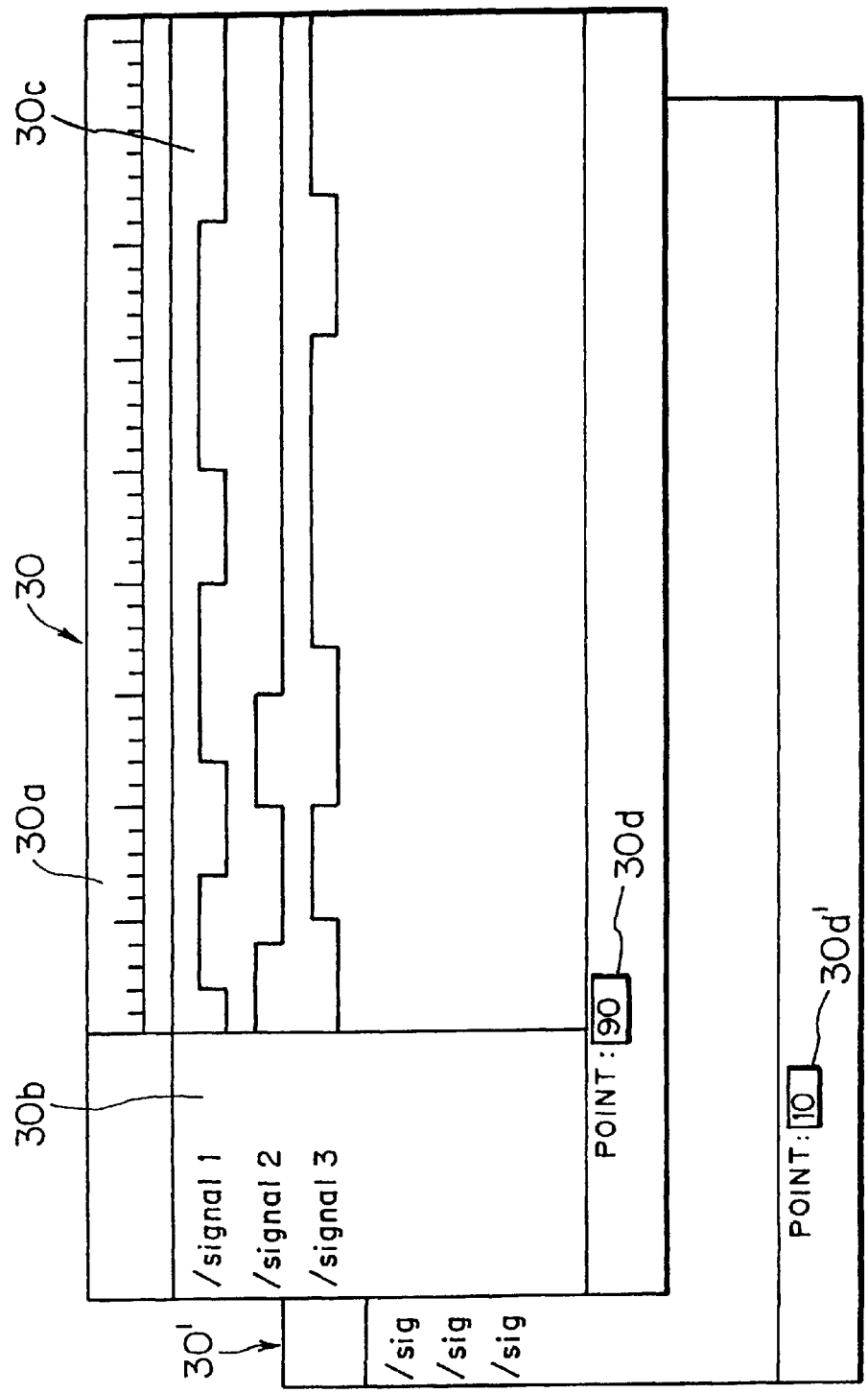
FIG. 9 is a chart showing a display example of a stream window in the embodiment.

FIG. 9 illustrates an example in which two stream windows 30 and 30' are displayed. In FIG. 9, 30*a* is a simulation time display region to display the simulation time in the right and left direction in a constant scale, 30*b* is a signal terminal name display region to display signal terminal names (/signal 1, /signal 2, /signal 3) of which the signal values are displayed in the stream window 30, 30*c* is a signal value display region to display the signal values corresponding to the signal terminal names in accordance with the stream of the simulation time, and 30*d* is a display point display region to indicate a display point designated in the stream window 30. A user or an operator changes a value of the display point displayed in the display point display region 30*d* on the screen shown in FIG. 9, and thereby, can change the display point in each cycle and switch the stream window 30 into a display state corresponding to the display point.

Figure 10:
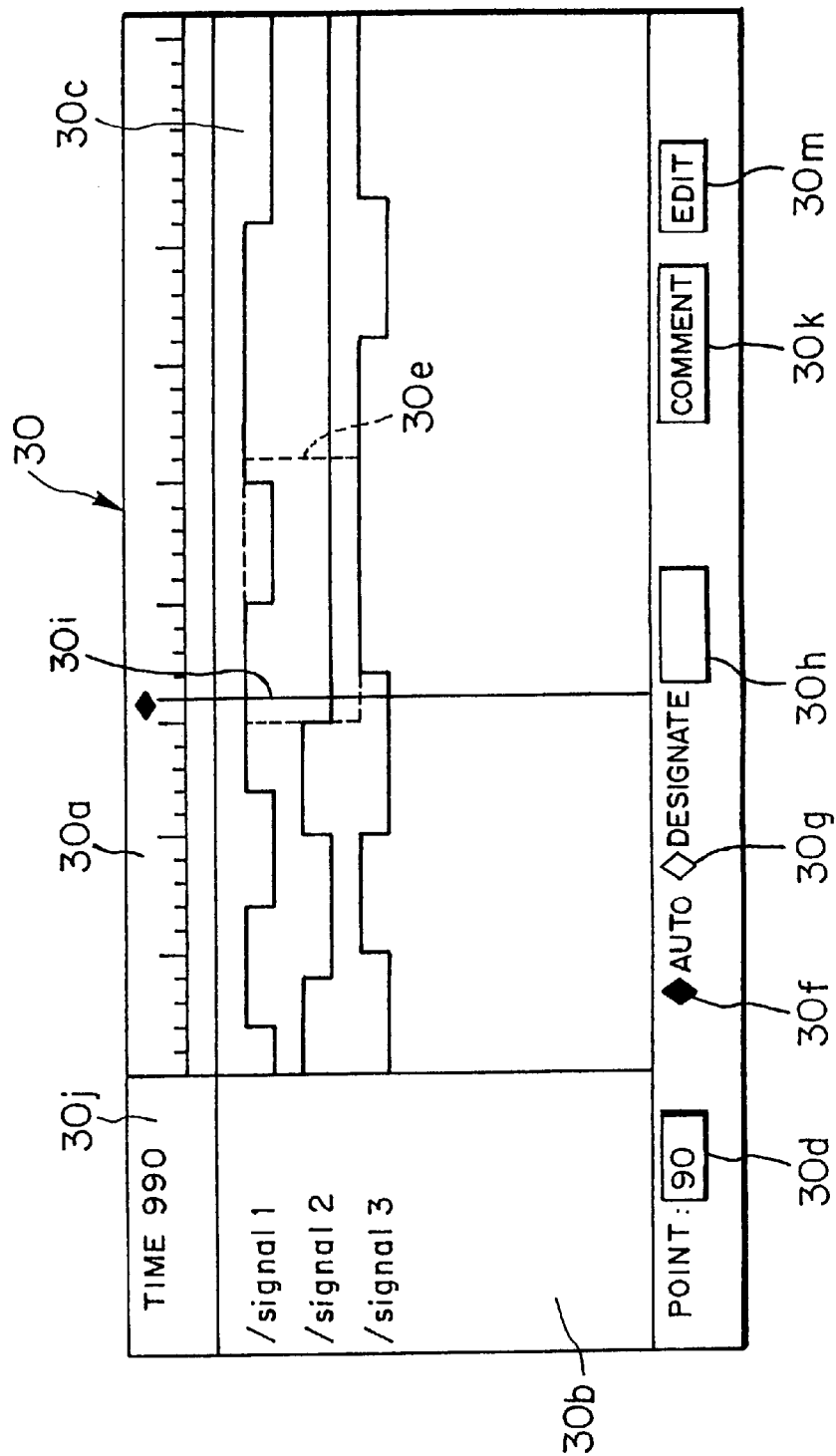
FIG. 10 is a chart showing a detailed display example of a stream window in the embodiment.
Figure 11:
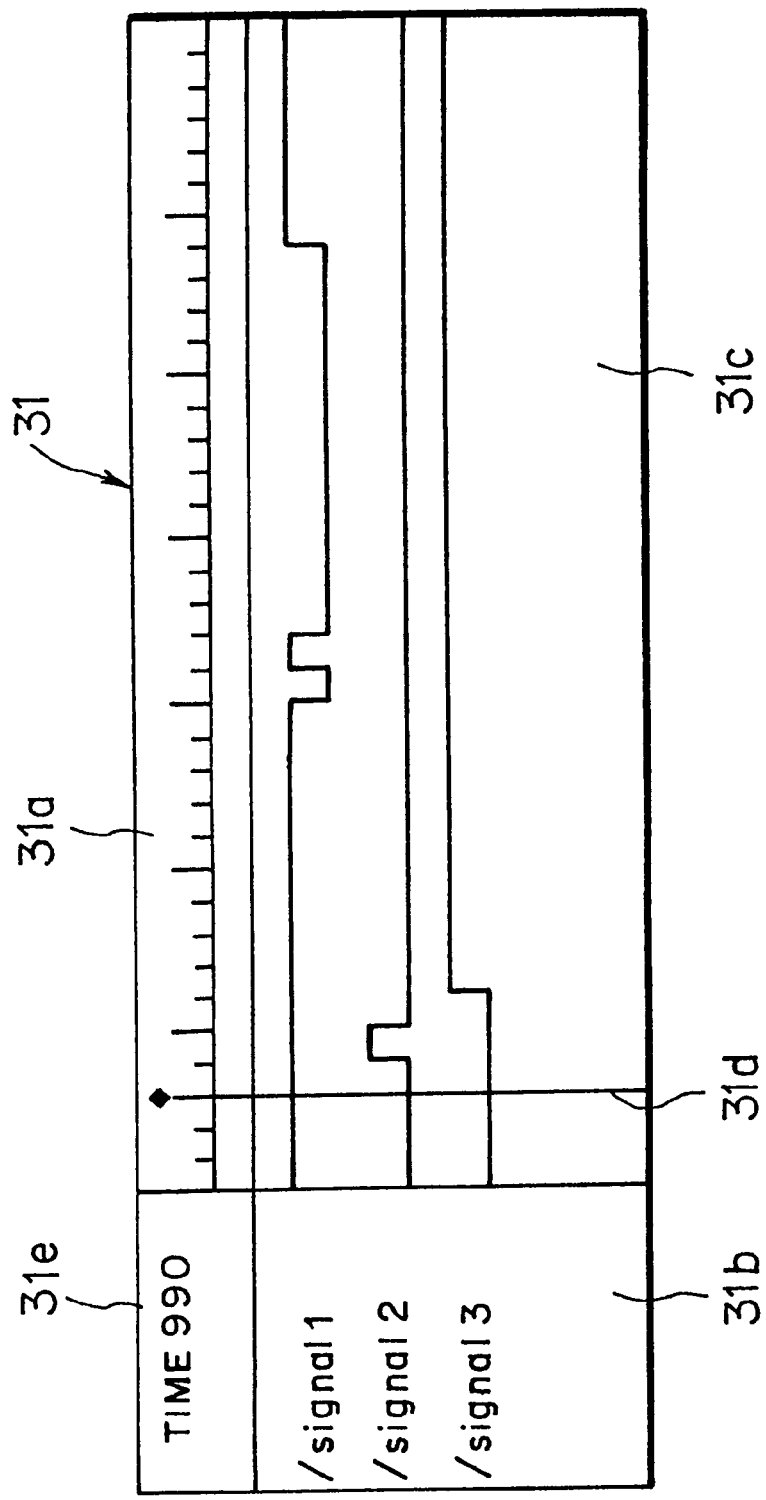
FIG. 11 is a chart showing a display example of a substream window in the embodiment.

FIG. 10 is a chart showing a more detailed display example of the stream window 30 in this embodiment, and FIG. 11 is a chart showing a display example of the substream window 31 displayed by designating a range in rectangle in the stream window 30 shown in FIG. 10. In FIG. 10, the same symbols as the symbols already described indicate the same parts, and the description of the parts will be omitted.

And, the substream window 31 shown in FIG. 11 is an example in which a range designated by the rectangular designation display 30*e* on the stream window 30 shown in FIG. 10 is displayed in detail by automatically setting the display point. In this case, since an auto mode setting region (toggle) 30*f* is selected on the stream window 30 shown in FIG. 10, performing the foregoing rectangular designation will automatically select the display point to display the substream window 31.

And, before the rectangular designation is performed, selecting a designating mode setting region (toggle) 30*g* will make a display point setting region 30*h* effective. Inputting and designating one or more display points in this display point setting region 30*h* will display the signal values at the display points continuously at each cycle in the substream window 31 shown in FIG. 11.

Thus, when the overall logic simulation result is observed on the stream window 30 by designating the display point at each cycle, the signal values in a certain time interval can easily be observed in detail by the substream window 31.

Further, when one point of the signal value display region or the time display region in the stream window 30, the time indicating marker 30*i* is to display a time corresponding to the point and is displayed with a longitudinal strip line in the stream window 30. The time (for example, 990) indicated by the time indicating marker 30*i* is displayed in a time display region 30*j* in the stream window 30.

Figure 12:
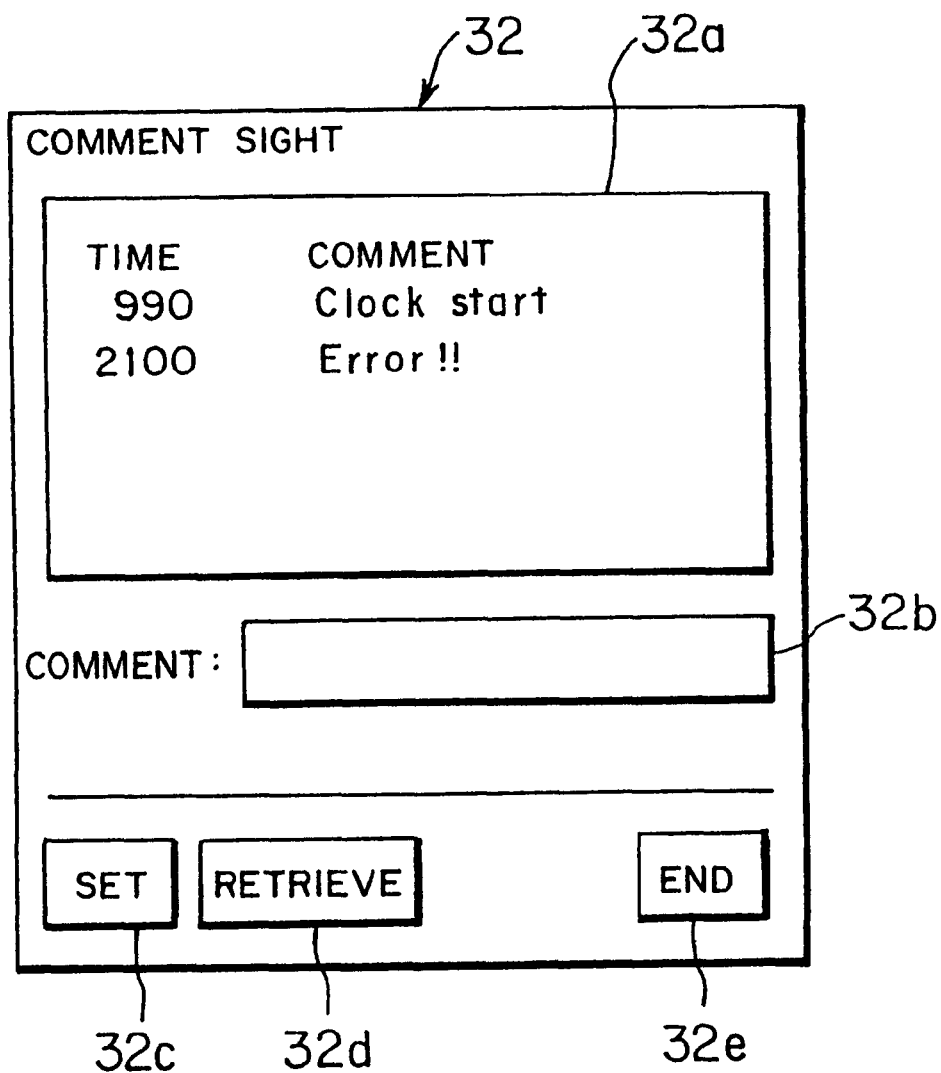
FIG. 12 is a chart showing an example of a comment input/retrieval screen in the embodiment.

Further, hitting the "conrnet" display region 30*k* will display the comment input/retrieval screen 32 shown in FIG. 12 on the display unit 11. On the comment input/retrieval screen 32, a comment can be applied to the latest time indicating marker 30*i*, or an already applied comment can be retrieved.

Figure 13:
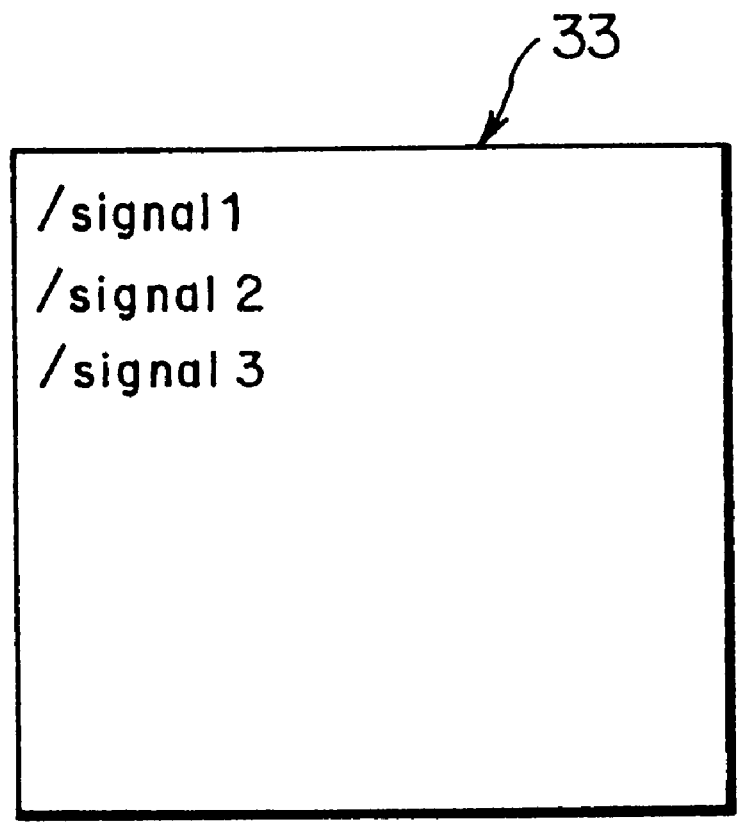
FIG. 13 is a chart showing an example of a screen for compiling signal terminal names in the embodiment.

Further, hitting the "edit" display region 30*m* will display the signal terminal name editing screen 33 shown in FIG. 13 on the display unit 11. On the signal terminal name editing screen 33, the signal terminal names displayed in the signal terminal name display region 30*b* are edited, and the edited result is automatically reflected on the display state of the signal values in the signal value display region 30*c*.

Further, in FIG. 11, 31*a* is a simulation time display region to display the simulation time in the right and left direction in a constant scale, 31*b* is a signal terminal name display region to display signal terminal names (/signal 1, /signal 2, /signal 3) of which the signal values are displayed in the substream window 31, 31*c* is a signal value display region to display the signal values corresponding to the signal terminal names in accordance with the stream of the simulation time, and 31*d* is a time indicating marker to indicate a time corresponding to the time indicating marker 30*i* being displayed in the stream window 30, and 31*e* is a time display region to display a time (for example, 990) indicated by the time indicating marker 31*d*.

FIG. 12 is a chart showing a display example of the comment input/retrieval screen 32 in this embodiment. The comment input/retrieval screen 32 is displayed on the display unit 11 by hitting the "comment" display region 30*k* in the stream window 30 shown in FIG. 10.

And, when applying a comment on the comment input/retrieval screen 32, giving the comment in a comment input region 32*b* and hitting a "set" display region 32*c* can set and apply the comment to the latest time indicating marker 30*i*.

Further, when retrieving a comment, giving the object comment for retrieval in the comment input region 32*b* and hitting a "retrieval" display region 32*d* will retrieve the comment from the comment control table 20. In this case, if the comment is retrieved, the comment screen is scrolled in the stream window 30, and a part including the time indicating marker 30*i*, to which the comment was applied, is displayed in the stream window 30.

Further, in FIG. 12, 32*a* is a comment sight display region to display a sight including already applied comments and times at which the comment are applied, and 32*e* is an "end" display region to be clicked on when ending the operation on the comment input/retrieval screen 32 and closing the screen 32.

FIG. 13 is a chart showing a display example of the signal terminal name editing screen 33 in this embodiment. Hitting the "edit" display region 30*m* in the stream window 30 shown in FIG. 10 will display a file in which the signal terminal names currently on display in the stream window 30 are enumerated. The signal terminal name editing screen 33 as shown in FIG. 13 is displayed on the display unit 11.

And, when a user or an operator edits a content displayed on the signal terminal name editing screen 33 and stores a new file after editing, the edited result is automatically reflected on the display state of the signal values in the signal value display region 30*c*. Thus, in this embodiment, it is easily performed to edit the display state in the signal terminal name display region 30*b* and the signal value display region 30*c*.

Next, the display processing operation of a logic simulation relating to this embodiment will be described with reference to FIG. 14 through FIG. 22.

First, In accordance with a flow chart (step S1 through S18) shown in FIG. 14, an input processing of the logic simulation support equipment 10 relating to the embodiment will be described.

When an event is given to the logic simulation support equipment 10 of the embodiment, the event is transmitted to the event analyzing unit 17 through the input output control unit 13, and step S1 executes a reception processing of the input event in the event analyzing unit 17.

Figure 15:
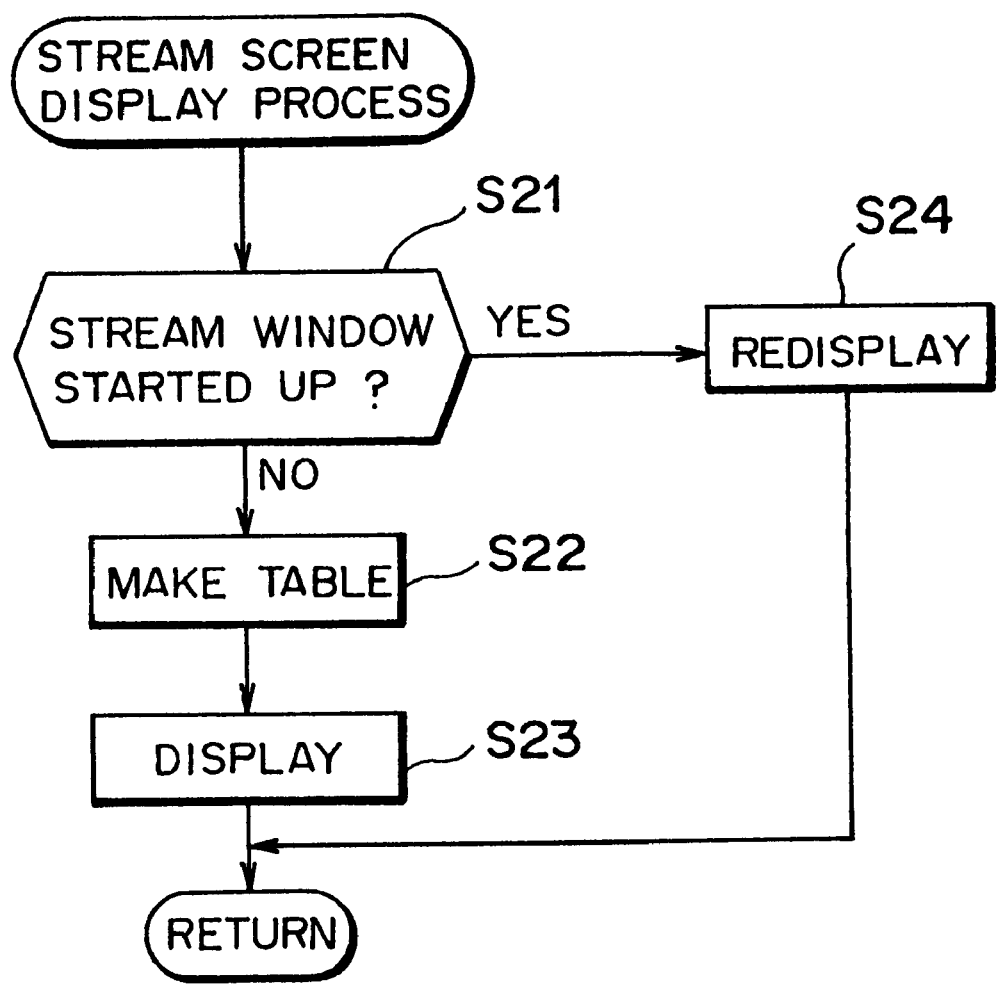
FIG. 15 is a flow chart for explaining an operation (stream display process) of the embodiment.

Next, step S2 judges whether or not the input event is an event for instructing to start up a stream display setting-up process; if the judgment is YES, step S11 starts up the stream display setting-up process shown in FIG. 15, and if the judgment is NO, the step goes to step S3.

Figure 16:
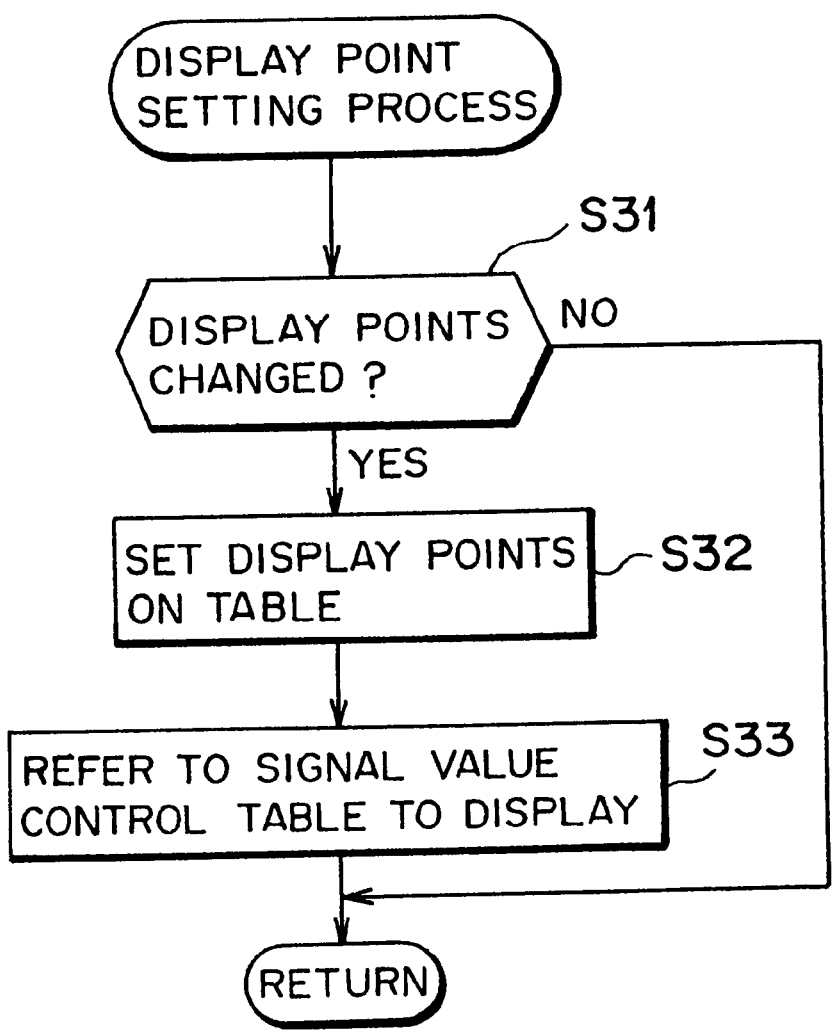
FIG. 16 is a flowchart for explaining an operation (display point setting process) of the embodiment.

Step S3 judges whether or not the input event is a display point setting event; if the judgment is YES, step S12 starts up a display point setting process shown in FIG. 16, and if the judgment is NO, the step goes to step S4.

Figure 17:
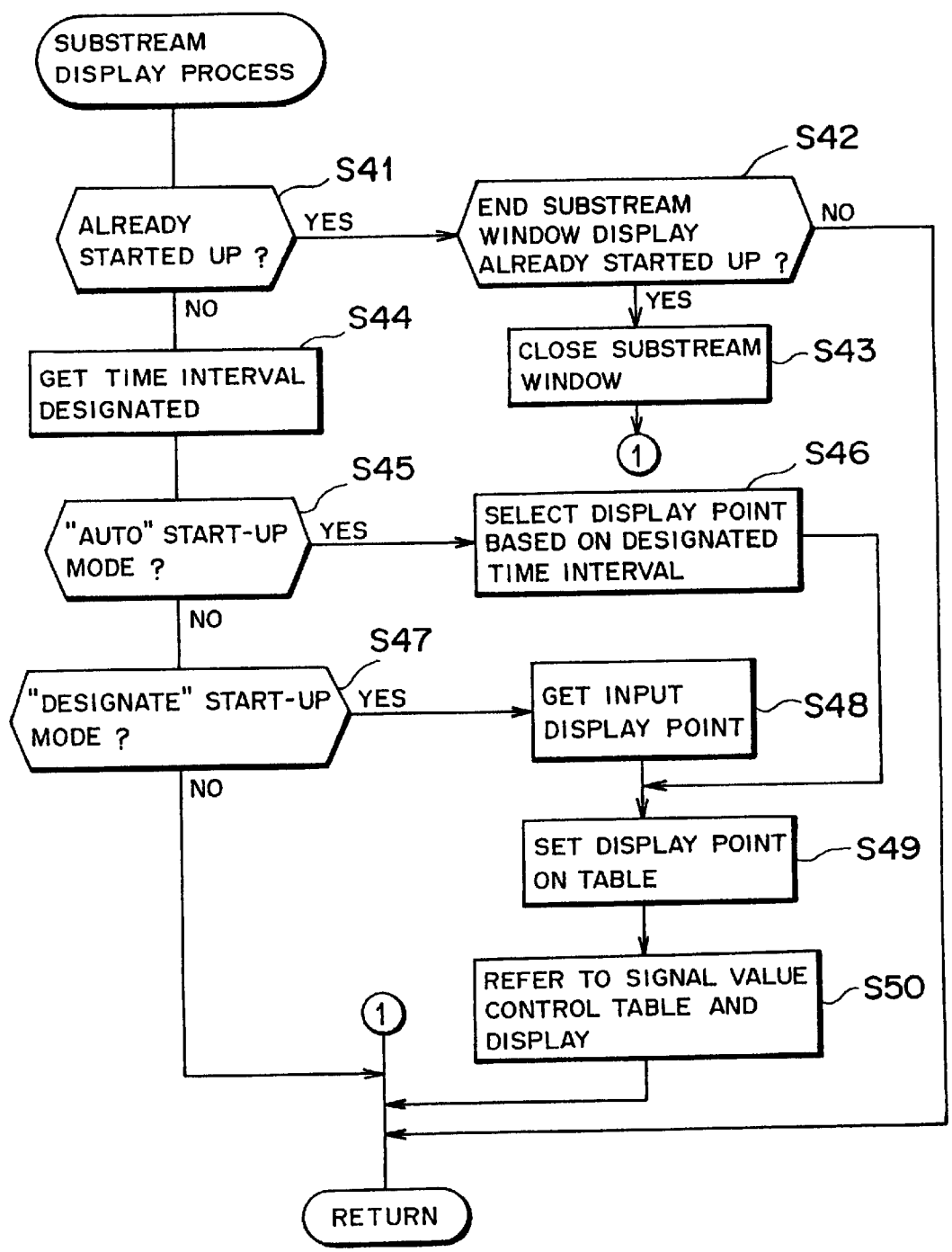
FIG. 17 is a flowchart for explaining an operation (substream display process) of the embodiment.

Step S4 judges whether or not the input event is an event for instructing to start up a substream display setting-up process; if the judgment is YES, step S13 starts up the substream display setting-up process shown in FIG. 17, and if the judgment is NO, the step goes to step S5.

Figure 18:
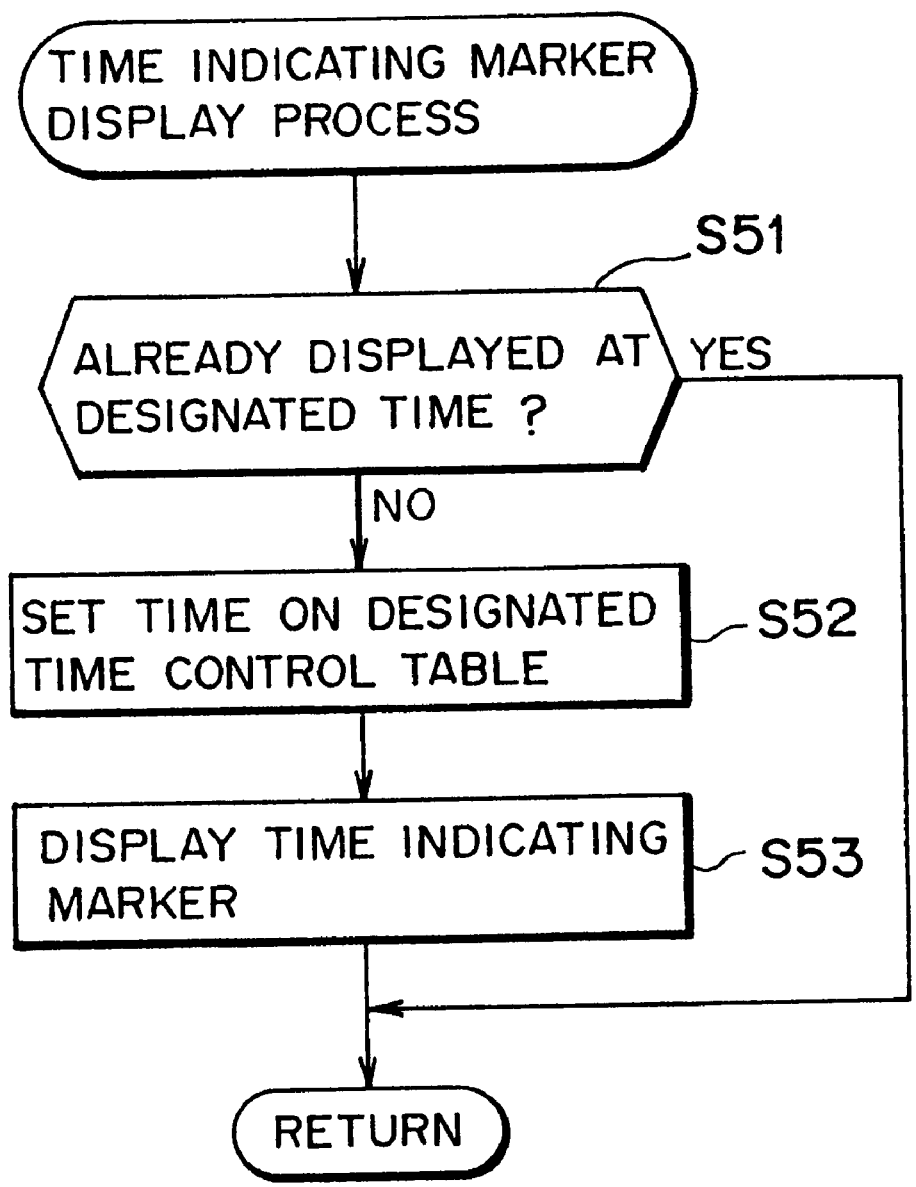
FIG. 18 is a flowchart for explaining an operation (display process of time indicating marker) of the embodiment.

Step S5 judges whether or not the input event is an event for instructing to start up a time indicating marker display process; if the judgment is YES, step S14 starts up the time indicating marker display process shown in FIG. 18, and if the judgment is NO, the step goes to step S6.

Figure 19:
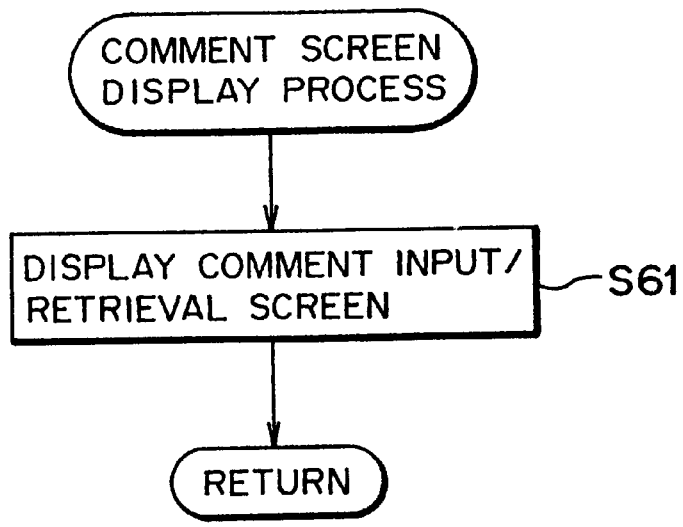
FIG. 19 is a flow chart for explaining an operation (comment display process) of the embodiment.

Step S6 judges whether or not the input event is an event for instructing to start up a comment screen display process; if the judgment is YES, step S15 starts up the comment screen display process shown in FIG. 19, and if the judgment is NO, the step goes to step S7.

Figure 20:
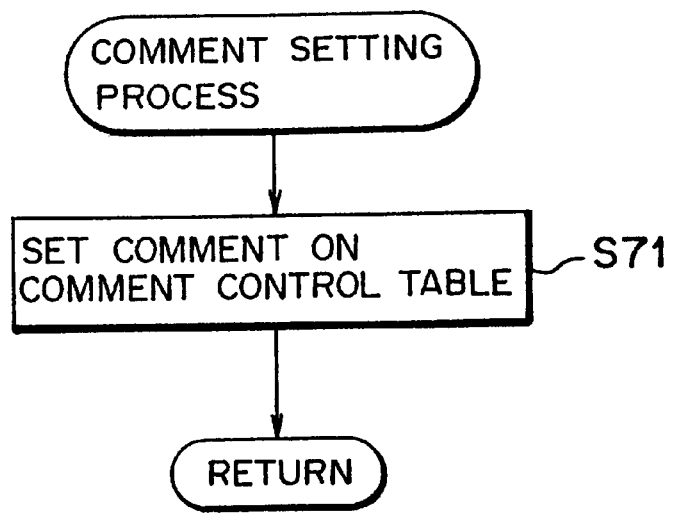
FIG. 20 is a flow chart for explaining an operation (comment setting process) of the embodiment.

Step S7 judges whether or not the input event is an event for instructing to start up a comment setting process; if the judgment is YES, step S16 starts up the comment setting process shown in FIG. 20, and if the judgment is NO, the step goes to step S8.

Figure 21:
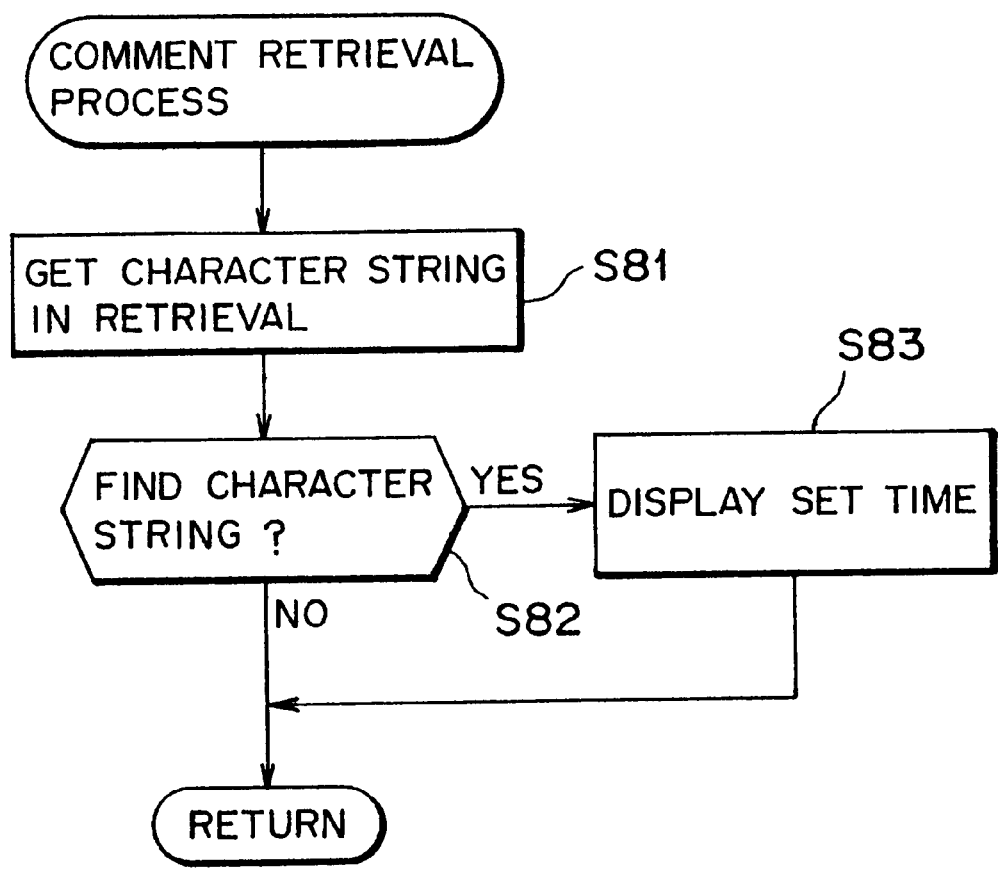
FIG. 21 is a flow chart for explaining an operation (comment retrieval process) of the embodiment.

Step S8 judges whether or not the input event is an event for instructing to start up a comment retrieval process; if the judgment is YES, step S17 starts up the comment retrieval process shown in FIG. 21, and if the judgment is NO, the step goes to step S9.

Figure 22:
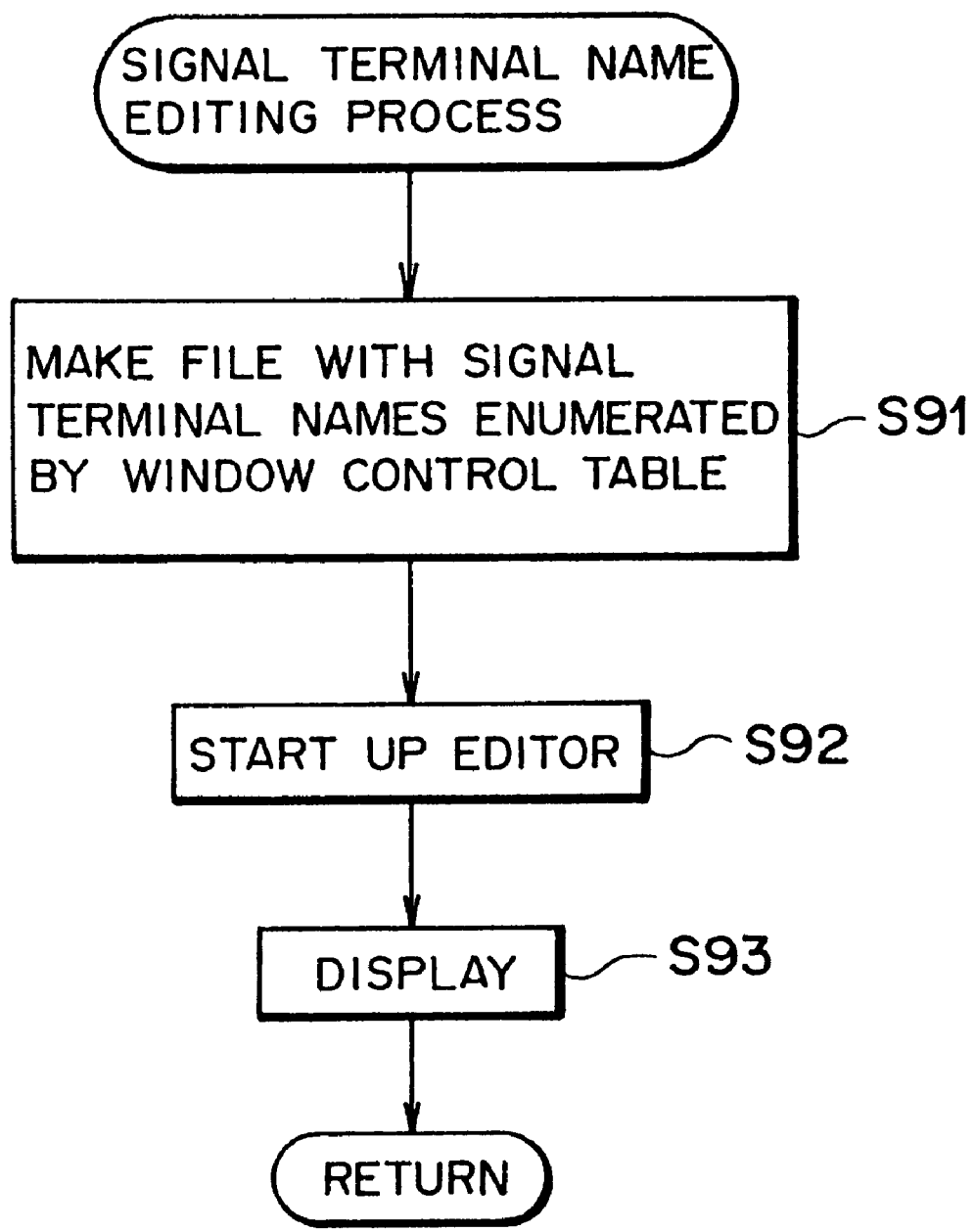
FIG. 22 is a flow chart for explaining an operation (compiling process of signal terminal names) of the embodiment.
Figure 23:
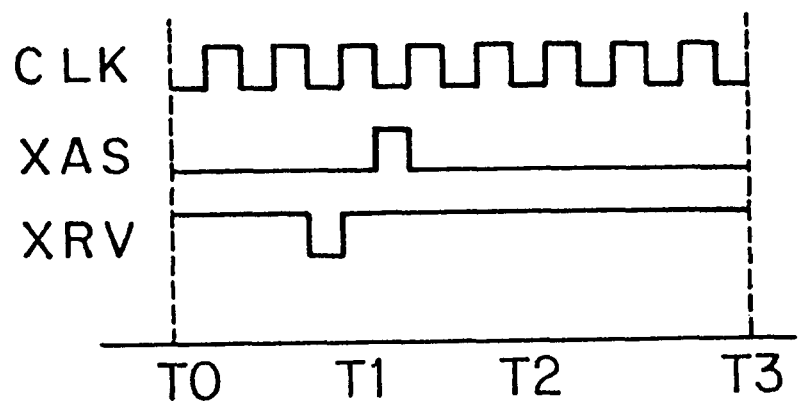
FIG. 23 is a chart showing a display example of a logic simulation result in the conventional system.
Figure 24:
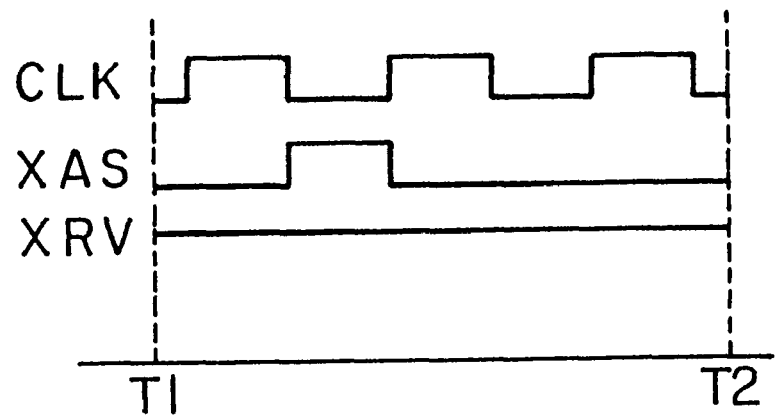
FIG. 24 is a chart showing an expanded display example of a logic simulation result in the conventional system.

Step S9 judges whether or not the input event is an event for instructing to start up an editing process; if the judgment is YES, step S18 starts up a signal terminal name editing process shown in FIG. 22, and if the judgment is NO, the step goes to step S10.

And, step S10 judges whether or not the input event is an event for instructing to end the processing; if the judgment is YES, this flow is ended, and on the other hand, if the judgment is NO, the step returns to the initial step S1 and repeats the same processings as above.

Next, the stream display setting-up process will be described in accordance with a flow chart (step S21 through S24) shown in FIG. 15.

When the stream display setting-up process is started up through the event input process (step S11 in FIG. 14), first, the stream display setting-up process judges whether or not the designated stream window 30 is already started up (step S21); if the stream window 30 is started up (YES judgment), this process executes replotting in accordance with the window control table 18, designated time control table 19, and signal value control table 21 (step S24).

On the other hand, if the stream window 30 is not yet started up (NO judgment at step S21), a display control data on a new stream window 30 is made to the window control table 18 (step S22), and in accordance with the display control data, the display control unit 16 controls a display state of the display unit 11 so as to display the new stream window 30 (step S23).

Next, the display point setting process will be described in accordance with a flow chart (step S31 through S33) shown in FIG. 16.

When the display point setting process is started up through the event input process (step S12 in FIG. 14), first, the display point setting process judges whether or not the stream and substream windows 30, 31 on display contain changes of the display points (step S31); if the display points do not involve any changes (NO judgment), this process ends as it stands.

On the other hand, if the display points involve changes (YES judgment), the display point (refer to ② in FIG. 3) in the window control table 18 is set to change (step S32), and then the values to the signal terminals (display states of the signal value display regions 30c, 31c) are redisplayed while referring to the signal value control table 21 (step S33).

Next, the substream display process will be described in accordance with a flow chart (step S41 through S50) shown in FIG. 17.

When the substream display process is started up through the event input process (step S13 in FIG. 14), first, the substream display process judges whether or not the designated substream window 31 is already started up (step S41); if the substream window 31 is started up (YES judgment), this process judges to end or not to end the display of the substream window 31 already started up (step S42). If the display is not ended (NO judgment), this process ends as it is, and on the other hand, if the display is ended (YES judgment), this process ends after closing the substream window 31 already started up (step S43).

On the other hand, if the substream window 31 is not yet started up (NO judgment at step S41), after step S44 acquires a designated time interval (display region of a new substream window 31; region designated by the rectangular designation), step S45 judges whether the display mode is auto or not.

If the judgment result is auto (YES judgment), step S46 selects an appropriate number of display points for the substream window 31 on the basis of the designated time interval. Step S49 sets the foregoing display points to the window control table 18, and thereafter, the display control unit 16 controls the display state on the display unit 11 so that step S50 refers to the signal value control table 21 to display a value relating to a signal terminal in the new substream window 31.

Further, if the display mode is not auto (NO judgment at step S45), step S47 judges whether or not the display mode is a designation mode. If the judgment result is a designation mode (YES judgment), step S48 acquires a display point set to the display point setting region 30h (refer to FIG. 10), and step S49 sets the display point to the window control table 18.

And, in the same manner as the foregoing, the display control unit 16 controls the display state on the display unit 11 so that step S50 refers to the signal value control table 21 to display a value relating to a signal terminal in the new substream window 31.

Further, if step S47 judges that the display mode is not a designation mode (NO judgment), this process ends without the new substream window 31 started up.

Next, the time indicating marker display process will be described in accordance with a flow chart (step S51 through S53) shown in FIG. 18.

When the time indicating marker display process is started up through the event input process (step S14 in FIG. 14), first, the time indicating marker display process judges whether or not the time indicating marker 30i is already displayed at the Designated time (step S51); if the marker is displayed (YES judgment), this process ends as it is. On the other hand, if the time indicating marker 30i is not yet displayed (NO judgment), the display control unit 16 controls the display state on the display unit 11 so that step S52 sets a time instructed by the time indicating marker 30i to the designated time control table 19 and step S53 displays a new time indicating marker 30i at a position corresponding to the time.

Next, the comment screen display process will be described in accordance with a flow chart (step S61) shown in FIG. 19.

When the comment screen display process is started up through the event input process (step S15 in FIG. 14), the display control unit 16 controls the display state on the display unit 11 so that step S61 displays the comment input/retrieval screen 32 shown in FIG. 12, and this process ends.

Next, the comment setting process will be described in accordance with a flow chart (step S71) shown in FIG. 20.

When the comment setting process is started up through the event input process (step S16 in FIG. 14), a comment set in the comment input region 32b of the comment input/retrieval screen 32 is set on the comment control table 20 (step S71).

Figure 14:
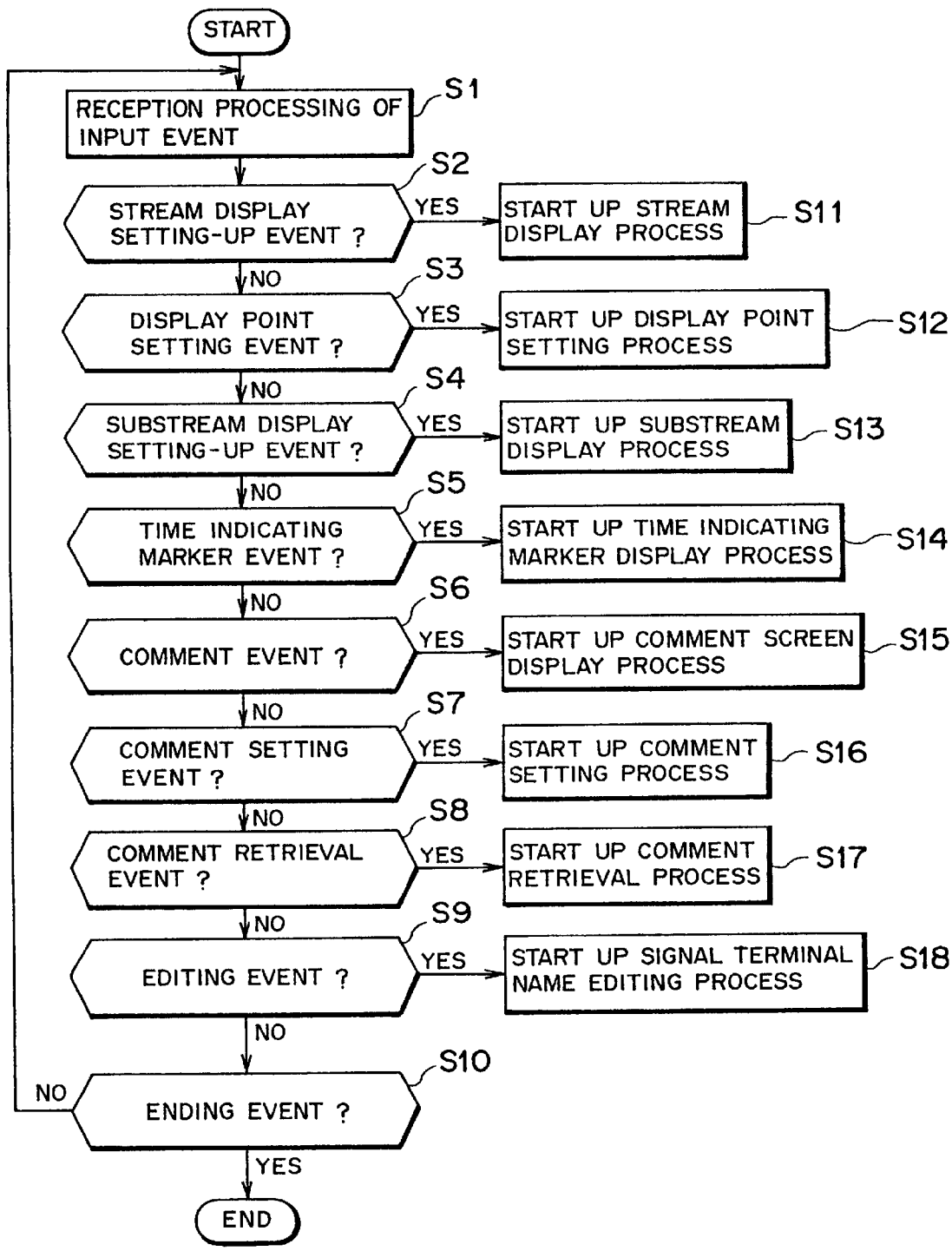
FIG. 14 is a flow chart for explaining an operation (input process) of the embodiment.

At the moment when the comment setting process is started up, the comment input/retrieval screen 32 is already displayed by the processing of step S15 in FIG. 14 and step S61 in FIG. 19. Hitting the "set" display region 32c on the comment input/retrieval screen 32 will create a comment setting event, and accordingly, a comment being set in the comment input region 32b at that moment is to be registered in the comment control table 20.

Next, the comment retrieval process will be described in accordance with a flow chart (step S81 through S83) shown in FIG. 21.

When the comment retrieval process is started up through the event input process (step S17 in FIG. 14), first, a character string to be retrieved is set in the comment input region 32b of the comment input/retrieval screen 32. And then, hitting the "retrieval" display region 32d will provide the character string to be retrieved (step S81). And, step S82 retrieves a comment that corresponds to the character string to be retrieved (comment) from the comment control table 20, and judges whether or not the corresponding comment is present.

If the corresponding comment is present (YES Judgment), the display control unit 16 controls the display state on the display, unit 11 so that step S83 sets a time at which the comment is applied on the window control table 18 and informs the time to the display control unit 16, and while performing an automatic scroll, displays a part including the indicating time (marker 30i) at which the comment is applied in the stream window 30. On the other hand, if the comment corresponding to the character string is not present (NO judgment at step S82), this process ends as it is.

Finally, the signal terminal name editing process will be described in accordance with a flow chart (step S91 through S93) shown in FIG. 22.

When the comment retrieval process is started up through the event input process (step S18 in FIG. 14), first, step S91 makes a file in which signal terminal names currently displayed are enumerated by referring to the window control table 18. Step S92 starts up the editor, reads the result that the editor edited the file, registers the signal terminal names in the window control table 18, and informs the names to the display control unit 16. In response to this, the display control unit 16 controls the display state on the display unit 11, and step S93 displays the edited signal terminal names in the signal terminal name display region 30b and reelects the editing state of the signal terminal names automatically on the display state of the signal values in the signal value display region 30c.

Thus, according to the embodiment of the invention, signal data at designated display points are continuously displayed at each cycle corresponding to a clock signal in the stream window 30 or the substream window 31 on the display unit 11; and therefore, an extended logic simulation result can effectively be displayed on one screen, and in addition in the cycle corresponding to the clock signal can be displayed only the signal data that an operator desires to refer to.

Accordingly, a logic circuit designer will be able to confirm the circuit operation while referring to the display on the display unit 11, and very easily the designer will be able to find errors in the logic circuits and explore the cause of the errors; thus enhancing the efficiency of the work to analyze a logic simulation result.

Further, when an overall logic simulation result is not needed to be observed, the reduced display of the overall logic simulation result becomes useless and difficult to observe. In this embodiment, however, the signal values are displayed only on the display points designated at each cycle; and thereby, a logic simulator result can be displayed very effectively in the stream window 30 or the substream window 31 on one screen.

Further, signal values in an optional time interval rectangularly designated on the stream window 30 can be displayed on the substream window 31 simultaneously with data on the stream window 30; and therefore, a logic circuit designer can refer to the stream window 30 that displays the perspective of a logic simulation result and the substream window 31 that displays detailed data in the optional time interval at the same time.

In other words, when analyzing a logic simulation result, while holding a display state of the stream window 30 as it is, only the data in a time interval that an operator desires to observe can be expanded to be displayed on the substream window 31, namely, when the operator desires to minutely observe only the data at a certain time, only the desired part can be displayed in detail without the overall picture expanded. Therefore, a logic circuit designer can continue without breaking thinking by switching the windows, and can perform the analysis of a logic simulation very efficiently.

Further, in this embodiment, the time indicating markers 30i, 31d for indicating times corresponding to designated points can be displayed, and even if the values (output waveforms) of multiple signal terminals are simultaneously displayed in the stream window 30 or the substream window 31, a logic circuit designer can easily grasp the signal state at the time by the markers 30i, 31d and can efficiently analyze a logic simulation result.

Further, a comment can be applied to the time indicating marker 30i displayed in the stream window 30; and therefore, a comment relating to the marker position (time) can be left with easiness to take a note on a memo pad and with a least job during the work to analyze a logic simulation result, and a more efficient work to analyze the logic simulation result can be done while referring to the comment.

And, since a logic circuit designer can retrieve a comment applied to the time indicating marker 30i and scroll and display a part including the time indicating marker 30i having the comment applied, the logic circuit designer can easily retrieve and confirm the part having the comment left, thus contributing to further increasing efficiency of the analysis work of a logic simulation result.

Further, the display part for signal terminal names in the stream window 30 can be edited so that the edited result can be reflected on che signal value display region 30c, and only the signal data of the signal terminals that an operator desires to refer to can be displayed in a desired order, thus greatly contributing to enhancing efficiency of the analysis work of a logic simulation result.

Further, in this embodiment, when storing signal data of a logic simulation result into the signal value control table 21, as shown in FIG. 5, the signal value control table 21 is designed to store only the signal data at a time that the signal data changed the value. Accordingly, if the signal data involves a long time and the quantity of the data is enormous, the signal data can efficiently be stored and held, which can significantly reduce the memory capacity and the cost.

Further, the invention is not limited to the aforementioned embodiment, and various modifications and variations can be applied within the true spirit and scope of the invention.

What is claimed is:

1. A method of displaying a waveform of signal data as logic simulation results of a logic circuit on a display unit, comprising the steps of:

designating a display point in one cycle corresponding to a clock signal to be used in executing a logic simulation;

fetching the signal data, which is stored along with the name of a corresponding signal terminal at each time when a value of the signal data changes during the logic simulation, at the display point for every cycle corresponding to the clock signals; and displaying the fetched signal data in a form compressed along an X coordinate on the display unit.

2. A logic simulation support equipment comprising:

a display unit to display a waveform of signal data as logic simulation results of a logic circuit;

a signal data storage unit to store the signal data, at each time when a value of the signal data chances during the logic simulation, along with the name of a corresponding signal terminal;

a designating unit to designate a display point in one cycle corresponding to a clock signal used in executing a logic simulation; and a display control unit to fetch from said signal data storage unit the signal data at the display point designated by said designating unit at every cycle corresponding to the clock signal and for controlling a display state of said display unit so as to display the signal data in accordance with the name of the corresponding signal terminal in a form compressed along an X coordinate on the display unit.

3. A logic simulation support equipment as claimed in claim 2, wherein said display control unit controls a display state of said display unit in such a manner that the signal data of signal terminals previously designated and the signal terminal names are displayed simultaneously in a plurality of windows in a stream format along a stream of logic simulation time.

4. A logic simulation support equipment as claimed in claim 3, wherein said display control unit controls a display state of said display unit in such a manner that a subwindow showing the signal data in detailed form at a logic simulation time in a range defined by a rectangular frame on the individual window is displayed simultaneously with the display of said individual window.

5. A logic simulation support equipment as claimed in claim 4, wherein, when displaying the subwindow, said display control unit controls the display state of said display unit such that an appropriate number of display points in one cycle corresponding to the clock signal are selected, and the signal data at the appropriate number of the display points are fetched from said signal data storage unit at every cycle corresponding to the clock signal and displayed in a form compressed along the X coordinate in the subwindow.

6. A logic simulation support equipment claimed in claim 4, further comprising:

setting unit to set an arbitrary number of display points in one cycle corresponding to the clock signal, wherein said display control unit controls the display state of said display unit such that the signal data at said display points set by said setting unit are fetched from said signal data storage unit at each cycle corresponding to the clock signal and are displayed in a form compressed along an X coordinate in the subwindow.

7. A logic simulation support equipment as claimed in claim 3, wherein when one point of a signal value display region or a time display region is designated in the window, said display control unit controls a display state of said display unit such that a marker indicating a time corresponding to the point is displayed in the window.

8. A logic simulation support equipment as claimed in claim 4, wherein when one point of a signal value display region or a time display region is designated in the subwindow, said display control unit controls a display state of said display unit such that a marker indicating a time corresponding to the point is displayed in the subwindow.

9. A logic simulation support equipment as claimed in claim 7, further comprising:

a comment applying unit to apply a comment to said marker displayed in the window; and a comment storage unit to store a comment applied to said marker by said comment applying unit.

10. A logic simulation support equipment as claimed in claim 9, further comprising:

a retrieval unit to execute a retrieval in said comment storage unit, upon receipt of a retrieval instruction on said comment, using said comment as a key, wherein when said comment to which said retrieval instruction is given is retrieved by said retrieval unit, said display control unit controls a display state of said display unit so as to execute a scroll in the window in such a manner that a window portion about said marker having said comment applied is displayed in the window.

11. A logic simulation support equipment as claimed in claim 3, further comprising:

a signal terminal name editing unit to edit names of signal terminals for the signal data to be displayed in the window and creating a file in which the names of the signal terminals are listed, wherein said display control unit controls a display state of said display unit in such a manner that, in the window, the signal terminal names listed in said file are displayed and the signal data of the signal terminals corresponding to said signal terminal names are displayed.

12. A logic simulation support equipment, comprising:

a display unit to display a waveform of signal data as logic simulation results of a logic circuit;

a signal data storage unit to store the signal data, at each time when a value of the signal data changes during the logic simulation, along with the name of a corresponding signal terminal;

a designating unit to designate a display point in one cycle corresponding to a clock signal used in executing a logic simulation;

a display control unit to fetch from said signal data storage unit the signal data at the display point designated by said designating unit at every cycle corresponding to the clock signal and for controlling a display state of said display unit so as to display the signal data in accordance with the name of the corresponding signal terminal in a form compressed along an X coordinate on the display unit; and a setting unit to set an arbitrary number of display points in one cycle corresponding in correspondence with the clock signal, wherein said display control unit controls the display state of said display unit such that the signal data at said display points set by said setting unit are fetched from said signal data storage unit at each cycle corresponding to the clock signal and are displayed in a form compressed along an X coordinate in a subwindow.

* * * * *